United States Patent
Sato et al.

(10) Patent No.: US 10,008,627 B2
(45) Date of Patent: Jun. 26, 2018

(54) PHOTOVOLTAIC CELL AND PHOTOVOLTAIC CELL MANUFACTURING METHOD

(71) Applicants: Shunichi Sato, Miyagi (JP); Nobuhiko Nishiyama, Tokyo (JP)

(72) Inventors: Shunichi Sato, Miyagi (JP); Nobuhiko Nishiyama, Tokyo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days. days.

(21) Appl. No.: 15/229,320

(22) Filed: Aug. 5, 2016

(65) Prior Publication Data

US 2016/0343898 A1    Nov. 24, 2016

Related U.S. Application Data

(63) Continuation of application No. 14/443,480, filed as application No. PCT/JP2013/082309 on Nov. 25, 2013, now Pat. No. 9,450,138.

(30) Foreign Application Priority Data

Nov. 26, 2012  (JP) ................. 2012-257829
Sep. 10, 2013  (JP) ................. 2013-187295

(51) Int. Cl.
  *H01L 21/00*  (2006.01)
  *H01L 31/18*  (2006.01)
  (Continued)

(52) U.S. Cl.
  CPC .. *H01L 31/1836* (2013.01); *H01L 31/035236* (2013.01); *H01L 31/043* (2014.12);
  (Continued)

(58) Field of Classification Search
  CPC ............. H01L 31/1892; H01L 31/043; H01L 31/035236; H01L 31/0687; H01L 31/1804; H01L 31/1852
  (Continued)

(56) References Cited

U.S. PATENT DOCUMENTS 5,904,549 A   5/1999   Sato
5,923,691 A   7/1999   Sato
(Continued)

FOREIGN PATENT DOCUMENTS

JP   S61-219182   9/1986
JP   H01-124271   5/1989
(Continued)

OTHER PUBLICATIONS

European search report dated Oct. 27, 2015 in corresponding European Patent Application No. 13856650.0.
(Continued)

*Primary Examiner* — Vu A Vu
(74) *Attorney, Agent, or Firm* — Cooper & Dunham LLP

(57) ABSTRACT

A photovoltaic cell manufacturing method includes depositing a first buffer layer for performing lattice relaxation on a first silicon substrate; depositing a first photoelectric conversion cell on the first buffer layer, the first photoelectric conversion cell being formed with a compound semiconductor including a pn junction, and the first photoelectric conversion cell having a lattice constant that is higher than that of silicon; connecting a support substrate to the first photoelectric conversion cell to form a first layered body; and removing the first buffer layer and the first silicon substrate from the first layered body.

18 Claims, 17 Drawing Sheets

(51) Int. Cl.
*H01L 31/0687* (2012.01)
*H01L 31/0352* (2006.01)
*H01L 31/043* (2014.01)

(52) U.S. Cl.
CPC .... *H01L 31/0687* (2013.01); *H01L 31/06875* (2013.01); *H01L 31/1804* (2013.01); *H01L 31/1852* (2013.01); *H01L 31/1892* (2013.01); *Y02E 10/544* (2013.01); *Y02P 70/521* (2015.11)

(58) Field of Classification Search
USPC .......................................................... 438/74
See application file for complete search history.

(56) References Cited

U.S. PATENT DOCUMENTS

| | | | |
|---|---|---|---|
| 5,939,733 | A | 8/1999 | Sato |
| 6,002,700 | A | 12/1999 | Sato |
| 6,015,980 | A * | 1/2000 | Bowers ............ H01L 29/66234 257/744 |
| 6,233,264 | B1 | 5/2001 | Sato |
| 6,281,518 | B1 | 8/2001 | Sato |
| 6,382,800 | B2 | 5/2002 | Sato |
| 7,338,883 | B2 | 3/2008 | Ghyselen et al. |
| 8,173,891 | B2 * | 5/2012 | Wanlass ............ H01L 31/0725 136/249 |
| 2004/0166681 | A1 | 8/2004 | Iles et al. |
| 2005/0087748 | A1 * | 4/2005 | Ohno ........................ B41J 2/45 257/88 |
| 2006/0112986 | A1 | 6/2006 | Atwater, Jr. et al. |
| 2009/0165839 | A1 | 7/2009 | Zeman et al. |
| 2010/0006136 | A1 * | 1/2010 | Zide ................... H01L 31/0687 136/244 |
| 2010/0083999 | A1 * | 4/2010 | Hovel .................... B82Y 20/00 136/244 |
| 2010/0129956 | A1 | 5/2010 | Chang et al. |
| 2010/0236620 | A1 | 9/2010 | Nakanishi et al. |
| 2010/0243038 | A1 | 9/2010 | Kukulka |
| 2011/0124146 | A1 | 5/2011 | Pitera et al. |
| 2011/0303273 | A1 * | 12/2011 | Harper ................... H01L 31/18 136/255 |
| 2012/0247547 | A1 | 10/2012 | Sasaki et al. |
| 2012/0273839 | A1 | 11/2012 | Hata et al. |
| 2013/0056053 | A1 * | 3/2013 | Lochtefeld .......... H01L 31/0687 136/255 |
| 2013/0335155 | A1 | 12/2013 | Sato |

FOREIGN PATENT DOCUMENTS

| | | |
|---|---|---|
| JP | H10-335683 | 12/1998 |
| JP | 2006-216896 | 8/2006 |
| JP | 2010-123916 | 6/2010 |
| JP | 2011-134952 | 7/2011 |
| JP | 2011-151392 | 8/2011 |
| JP | 2012-054388 | 3/2012 |
| JP | 2012-518289 | 8/2012 |
| JP | 2012-209534 | 10/2012 |
| JP | 2014-199915 | 10/2014 |
| WO | WO 2014/142340 A1 | 9/2014 |

OTHER PUBLICATIONS

International Search Report dated Feb. 10, 2014 in PCT/JP2013/082309 filed on Nov. 25, 2013.

Yamaguchi et al, "High Performance and Radiation-Resistance of GaAs-on-Si Solar Cells With Novel Structures", Proceedings of the 28th IEEE Photovoltaic Specialists Conference (2002), pp. 860-863.

Tanabe et al. "Wafer-Bonded AlGaAs/Si Dual-Junction Solar Cells", The Japan Society of Applied Physics Autumn proceedings, 2010, 15p-NC-4.

Mitsuhara et al. "Starin-compensated InGaP/InGaP MQW for the application to tandem solar cells", The Japan Society of Applied Physics Spring proceedings, 2012, 17p-DP3-6.

Archer et al. "GaInP/GaAs dual junction solar cells on Ge/Si epitaxial templates", Appl.Phys.Lett.92, 103503, (2008).

Schöne et al. "III-V solar cell growth on wafer-bonded GaAs/Si-substrates",Proceedings of the IEEE 4th World Conference on Photovoltaic Energy Conversion (2006), pp. 776-779.

Zahler et al. "High efficiency InGaAs solar cells on Si by InP layer transfer", Appl.Phys.Lett.91, 012108, (2007).

B.E. Sağol, et al. "Lifetime and Performance of InGaAsP and InGaAs Absorbers for Low Bandgap Tandem Solar Cells", Proceedings of the 28th IEEE Photovoltaic Specialists Conference (2009) pp. 1090-1093.

Sugiyama et al. "Quantum tandem-type high-efficiency photovoltaic cell", Applied physics, vol. 79, No. 5, 2010, pp. 435-439.

Tobias et al. "Ideal Efficiency of Monolithic, Series-Connected Multijunction Solar Cells", Progress in Photovoltaics: Research and Applications (2002),10, pp. 323-329.

Takamoto et al. "World's Highest Efficiency Triple-Junction Solar Cells Fabricated by Inverted Layers Transfer Process", Proceedings of the 29th IEEE Photovoltaic Specialists Conference (2010) pp. 412-417.

Japanese official action dated Aug. 22, 2017 in connection with corresponding Japanese patent application No. 2013-187295.

* cited by examiner

PHOTOVOLTAIC CELL AND PHOTOVOLTAIC CELL MANUFACTURING METHOD

CROSS-REFERENCE TO RELATED APPLICATIONS

This application is a Rule 1.53(b) continuation of application Ser. No. 14/443,480, filed May 18, 2015 as a U.S. national phase application under 35 U.S.C. 371 of International Application No. PCT/JP2013/082309 filed Nov. 25, 2013.

TECHNICAL FIELD

The present invention relates to a photovoltaic cell manufacturing method.

BACKGROUND ART

Compound semiconductors have different levels of band gap energy and lattice constants according to the material composition. Therefore, a multi-junction photovoltaic cell is produced, by which the wavelength range of sunlight is divided among a plurality of photovoltaic cells so that the energy conversion efficiency is increased.

Presently, a typical example of a multi-junction photovoltaic cell is a triple-junction photovoltaic cell (1.9 eV/1.4 eV/0.67 eV) including Ge cell/Ga(In)As cell/GaInP cell using a lattice matching material, provided on a germanium (Ge) substrate having substantially the same lattice constant as that of gallium arsenide (GaAs).

The efficiency of a photovoltaic cell made of a compound semiconductor is approximately two times as high as that of a silicon (Si) photovoltaic cell. However, a photovoltaic cell made of a compound semiconductor has a high-cost substrate or a small-sized substrate, and is thus significantly more expensive than a silicon photovoltaic cell. Accordingly, a photovoltaic cell made of a compound semiconductor is used for special purposes, mainly for use in space.

Furthermore, recently, a concentrated photovoltaic cell is formed by combining an inexpensive condensing lens made of plastic and a small cell of a photovoltaic cell made of a compound semiconductor. Accordingly, the usage amount of an expensive compound semiconductor is reduced compared to a typical flat plate photovoltaic cell formed without using a condensing lens. Such a concentrated photovoltaic cell can be manufactured at a lower cost and is used practically as a photovoltaic cell for general purposes other than special purposes as described above.

However, the power generation cost of a photovoltaic cell still remains high, and therefore it is imperative to further reduce the cost. Thus, studies are being conducted to increase the energy conversion efficiency and to reduce the manufacturing cost.

As an example of reducing cost, studies are being conducted to produce a photovoltaic cell with a compound semiconductor on a Si substrate that costs less by approximately one digit and whose area can be made large (see, for example, Non-patent Document 1). However, a Si substrate and a photovoltaic cell made of a compound semiconductor have different lattice constants, and a dislocation can occur due to lattice relaxation. Thus, a buffer layer is provided between the Si substrate and the photovoltaic cell layer for relaxing the lattice constant (performing lattice relaxation), in order to cause the difference in the lattice constant to relax as much as possible in the buffer layer, and therefore reduce the dislocation in the compound semiconductor.

Furthermore, there is proposed a method of forming a photovoltaic cell layer on each of the Si substrate and the GaAs substrate, pasting these together by a direct bonding method and removing the GaAs substrate, and forming a double-junction photovoltaic cell on the Si substrate (see, for example, Non-patent Documents 2 and 3).

Furthermore, there is proposed a method of manufacturing a photovoltaic cell by a smart cut method which involves implanting H+ ions, etc., inside a semiconductor substrate and peeling off a thin-layer from the substrate starting from the part where ions have been implanted. After implanting the ions, a Si substrate is bonded together with a Ge substrate, a GaAs substrate, or an InP substrate via $SiO_2$. Then, by a heating process, the Ge substrate, the GaAs substrate, or the InP substrate is peeled off, and a photovoltaic cell made of a compound semiconductor is formed on a template substrate constituted by a Ge layer, a GaAs layer, or an InP-layer provided on the Si substrate (see, for example, Non-patent Documents 4, 5, and 6).

However, by the above methods of manufacturing a photovoltaic cell made of a compound semiconductor, an expensive GaAs substrate or InP substrate is used, and therefore the photovoltaic cell made of a compound semiconductor cannot be manufactured at a low cost.

As described above, by conventional manufacturing methods, the photovoltaic cell made of a compound semiconductor cannot be manufactured at a low cost.

Non-patent Document 1: Yamaguchi et al, Proceedings of the 28th IEEE Photovoltaic Specialists Conference (2002), pp. 860-863

Non-patent Document 2: The Japan Society of Applied Physics Autumn proceedings, 2010, 15p-NC-4

Non-patent Document 3: The Japan Society of Applied Physics Spring proceedings, 2012, 17p-DP3-6

Non-patent Document 4: Appl. Phys. Lett. 92, 103503, (2008)

Non-patent Document 5: Proceedings of the IEEE 4th World Conference on Photovoltaic Energy Conversion (2006), pp. 776-779.

Non-patent Document 6: Appl. Phys. Lett. 91, 012108, (2007)

Patent Document 1: Japanese Laid-Open Patent Publication No. S61-219182

Patent Document 2: Japanese Laid-Open Patent Publication No. 2006-216896

DISCLOSURE OF INVENTION

The present invention has been made in view of the above-described problems, and it is an object of at least one embodiment of the present invention to provide a photovoltaic cell manufacturing method for manufacturing a photovoltaic cell made of a compound semiconductor, at a low cost.

An aspect of the present invention provides a photovoltaic cell manufacturing method which includes depositing a first buffer layer for performing lattice relaxation on a first silicon substrate; depositing a first photoelectric conversion cell on the first buffer layer, the first photoelectric conversion cell being formed with a compound semiconductor including a pn junction, and the first photoelectric conversion cell having a lattice constant that is higher than that of silicon; connecting a support substrate to the first photoelectric conversion cell to form a first layered body; and removing the first buffer layer and the first silicon substrate from the first layered body.

BEST MODE FOR CARRYING OUT THE INVENTION

Embodiments of the present invention are described below with reference to the accompanying drawings.

First Embodiment

FIGS. 1A through 3 illustrate a photovoltaic cell manufacturing method according to a first embodiment.

Figure 1A:
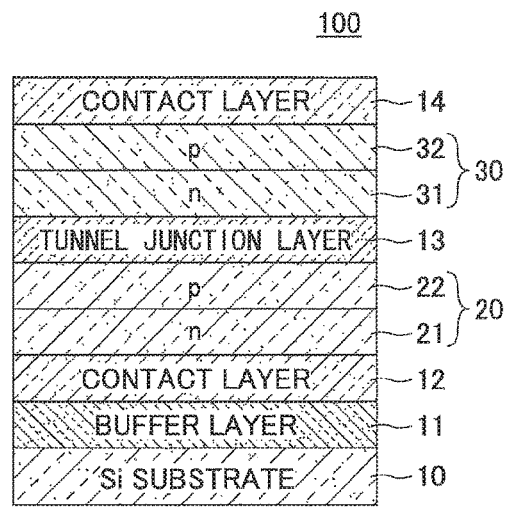
FIGS. 1A and 1B illustrate a photovoltaic cell manufacturing method according to a first embodiment.

First, as illustrated in FIG. 1A, a buffer layer 11, a contact layer 12, a GaInP cell 20, a tunnel junction layer 13, a GaAs cell 30, and a contact layer 14, are sequentially formed on a Si substrate 10. A layered body 100 illustrated in FIG. 1A is made assuming that sunlight enters from the bottom side as viewed in FIG. 1A.

The Si substrate 10 may be, for example, a substrate made of a non-doped silicon single crystal. As the Si substrate 10, for example, a silicon wafer having a size of 8 inches or 12 inches may be used. Note that the Si substrate 10 is not limited to the above, and any kind of substrate may be used.

The buffer layer 11 is formed by depositing, on one side of the Si substrate 10, two layers, i.e., a silicon germanium (SiGe) layer and a germanium (Ge) layer. The SiGe layer and the Ge layer may be formed by, for example, a CVD (Chemical Vapor Deposition) method.

The SiGe layer includes a defect that is caused by the difference in the lattice constant of the Si crystal and the Ge crystal, and therefore the SiGe layer becomes a layer in which the difference in the lattice constant is relaxed (lattice relaxation is performed). The SiGe layer is deposited on the Si substrate 10 in order to relax the difference between the lattice constant of the compound semiconductor layer to be formed later and the lattice constant of the Si substrate 10. Furthermore, the Ge layer is deposited on the SiGe layer, because the Ge layer has a lattice constant that is close to that of the compound semiconductor layer to be formed later.

As described above, the difference in the lattice constant is relaxed in the SiGe layer, and therefore the Ge layer formed on the SiGe layer is grown with hardly any distortion. Due to the above reasons, on the back side of the Si substrate 10, a SiGe layer is formed, and on the back side of the buffer layer 11, a Ge layer is formed.

Note that the buffer layer 11 may not be formed to have a two layer structure of a SiGe layer and a Ge layer, but may be formed to have a structure in which the ratio of silicon and germanium is continuously changed. For example, first, a SiGe layer having a high silicon ratio may be formed on one side of the Si substrate 10, and the ratio of Ge may be gradually increased so that a Ge layer is attained on the back side, to form the buffer layer 11.

The contact layer 12 is mainly a layer to be deposited on the buffer layer 11 for ohmic-connecting with a metal layer 17 (see FIG. 3) to be formed later, and for example, a gallium arsenide (GaAs) layer is used as the contact layer 12. For example, the GaAs layer used as the contact layer 12 may be formed on the buffer layer 11 by a MOCVD (Metal Organic Chemical Vapor Deposition) method.

The GaAs layer used as the contact layer 12 has a lattice constant that is significantly close to that of the Ge layer positioned at the topmost layer of the buffer layer 11. Therefore, it is possible to cause crystal growth of a GaAs layer used as the contact layer 12, on the buffer layer 11. Note that it is possible to cause crystal growth of a GaInAs layer having a composition that lattice-matches Ge, as the contact layer 12.

The GaInP cell 20 is a photoelectric conversion cell made of a compound semiconductor, including gallium (Ga), indium (In), and phosphorus (P) as raw materials. The GaInP cell 20 includes an n-layer 21 and a p-layer 22. For example, the GaInP cell 20 is formed by a MOCVD method, by sequentially depositing the n-layer 21 and the p-layer 22 on the contact layer 12.

As the dopant of the n-layer 21, for example, silicon (Si) or selenium (Se) may be used. Furthermore, as the dopant of the p-layer 22, for example, zinc (Zn) or magnesium (Mg) may be used.

In the first embodiment, the composition of Ga, In, and P is adjusted so that the band gap of the GaInP cell 20 becomes 1.9 eV. Furthermore, the GaInP cell 20 has a lattice constant that is significantly close to the lattice constant (approximately 5.65 Å) of the GaAs layer used as the contact layer 12. The composition of Ga, In, and P is adjusted so that the GaInP cell 20 can crystal-grow on the contact layer 12.

Note that between the n-layer 21 and the contact layer 12 (incident side to the GaInP cell 20), a window layer having a wider gap than that of the GaInP cell 20 may be formed. Furthermore, above the p-layer 22 (between the p-layer 22 and the tunnel junction layer 13), a BSF (Back Surface Field) layer having a wider gap than that of the GaInP cell 20 may be formed.

The tunnel junction layer 13 is provided between the GaInP cell 20 and the GaAs cell 30, and includes an n-layer and p-layer that have been doped at a higher density than that of the n-layer 21 and the p-layer 22 of the GaInP cell 20 and an n-layer 31 and a p-layer 32 of the GaAs cell 30. The tunnel junction layer 13 is a junction layer, which is provided so that a current flows between the p-layer 22 of the GaInP cell 20 and the n-layer 31 of the GaAs cell 30 (by tunnel junction).

For example, the tunnel junction layer 13 is formed by a MOCVD method, by sequentially depositing an AlGaAs layer (p-layer) and a GaInP-layer (n-layer) in the stated order on the surface of the GaInP cell 20. The p-layer and the n-layer of the tunnel junction layer 13 are preferably formed with a material having a wider band gap than that of the GaInP cell 20. This is to prevent the light that has been transmitted through the GaInP cell 20 from being absorbed at the tunnel junction layer 13.

Note that the tunnel junction layer 13 has a lattice constant that is significantly close to the lattice constant (approximately 5.65 Å) of the GaAs layer. The composition of Ga, In, and P is adjusted so that the tunnel junction layer 13 can crystal-grow on the GaInP cell 20.

The GaAs cell 30 is a photoelectric conversion cell made of a compound semiconductor, including gallium (Ga) and arsenic (As) as raw materials. The GaAs cell 30 includes the n-layer 31 and the p-layer 32. For example, the GaAs cell 30 is formed by a MOCVD method, by sequentially depositing the n-layer 31 and the p-layer 32 on the tunnel junction layer 13.

As the dopant of the n-layer 31, for example, silicon (Si) or selenium (Se) may be used. Furthermore, as the dopant of the p-layer 32, for example, zinc (Zn) or magnesium (Mg) may be used.

Note that the GaAs cell 30 has a lattice constant of approximately 5.65 Å, and therefore the GaAs cell 30 can crystal-grow on the tunnel junction layer 13.

Note that between the n-layer 31 and the tunnel junction layer 13 (incident side to the GaAs cell 30), a window layer having a wider gap than that of the GaAs cell 30 may be formed. Furthermore, above the p-layer 32 (between the p-layer 32 and the contact layer 14), a BSF (Back Surface Field) layer having a wider gap than that of the GaAs cell 30 may be formed.

The contact layer 14 is mainly a layer to be deposited on the GaAs cell 30 for ohmic-connecting with an electrode to be formed later (metal layer 15A), and for example, a gallium arsenide (GaAs) layer is used as the contact layer 14. For example, the GaAs layer used as the contact layer 14 may be formed on the GaAs cell 30 by a MOCVD method.

Note that the contact layer 14 is constituted by a GaAs layer, and therefore the lattice constant is approximately 5.65 Å, and can crystal-grow on the GaAs cell 30.

As described above, the layered body 100 illustrated in FIG. 1A is formed by sequentially depositing, on the Si substrate 10 and the buffer layer 11, the contact layer 12 that constitutes the light incident side, the GaInP cell 20, the tunnel junction layer 13, the GaAs cell 30, and the contact layer 14, in the stated order.

Accordingly, the GaInP cell 20 (1.9 eV) having a wide band gap is disposed closer to the light incident side, than the GaAs cell 30 (1.4 eV). This is to absorb the short wavelength light at the GaInP cell 20 on the light incident side, and to absorb the light having a relatively long wavelength that has been transmitted through the GaInP cell 20, at the GaAs cell 30.

Figure 1B:
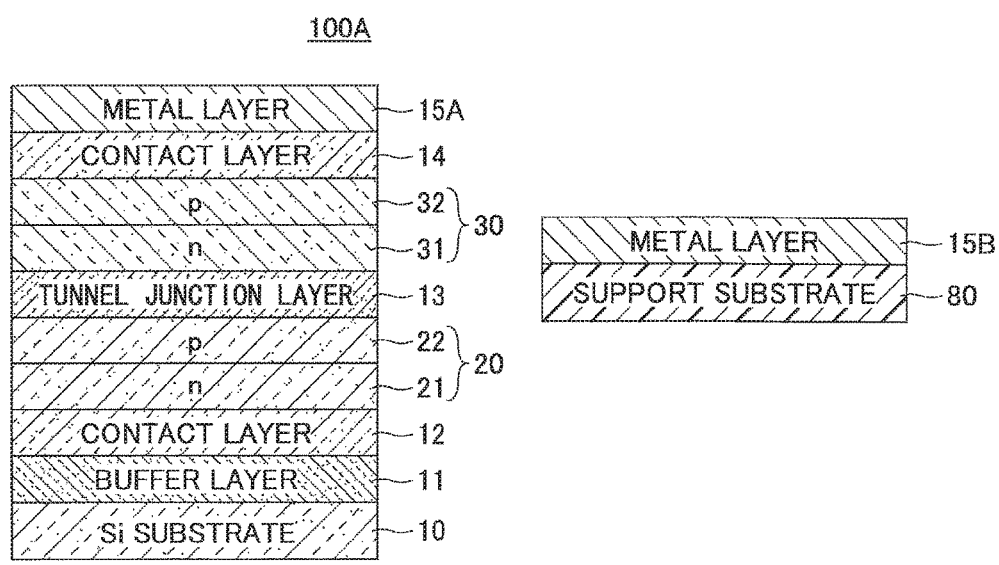

Next, as illustrated in FIG. 1B, a support substrate 80 is prepared, and the metal layer 15A is formed on the contact layer 14, and a metal layer 15B is formed on the support substrate 80. The metal layers 15A, 15B are thin films made of a metal such as gold (Au) or silver (Ag), and may be formed by a vapor deposition method or a sputtering method. Furthermore, the support substrate 80 may be, for example, a film made of plastic.

Note that the object formed by forming the metal layer 15A on the contact layer 14 of the layered body 100 illustrated in FIG. 1A is referred to as a layered body 100A.

Figure 2A:
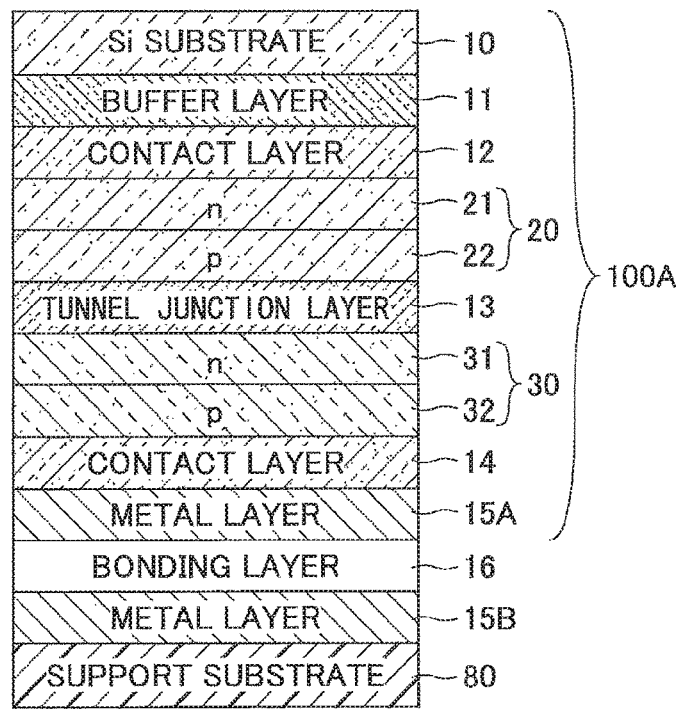
FIGS. 2A and 2B illustrate the photovoltaic cell manufacturing method according to the first embodiment.

Next, as illustrated in FIG. 2A, the layered body 100A is turned upside down, and a bonding layer 16 is used to bond the metal layer 15A of the layered body 100A with the metal layer 15B formed on the surface of the support substrate 80.

The bonding layer 16 is formed by, for example, applying, on the surface of the metal layer 15A or the metal layer 15B, a joining material such as a conductive epoxy agent formed, for example, by including silver (Ag) nanoparticles in epoxy resin. The bonding layer 16 is formed by, for example, applying the joining material on the surface of the metal layer 15A or the metal layer 15B by screen printing.

A layered body 100B as illustrated in FIG. 2A is formed by joining together the metal layer 15A and the metal layer 15B by using the bonding layer 16 as described above. In this case, the bonding layer 16 is heated so that the metal layer 15A and the metal layer 15B are fused together by the bonding layer 16. The layered body 100B includes the layered body 100A, the bonding layer 16, the metal layer 15B, and the support substrate 80.

Note that the metal layer 15A, the bonding layer 16, and the metal layer 15B are used as the bottom electrode (backside electrode) of the photovoltaic cell.

Figure 2B:
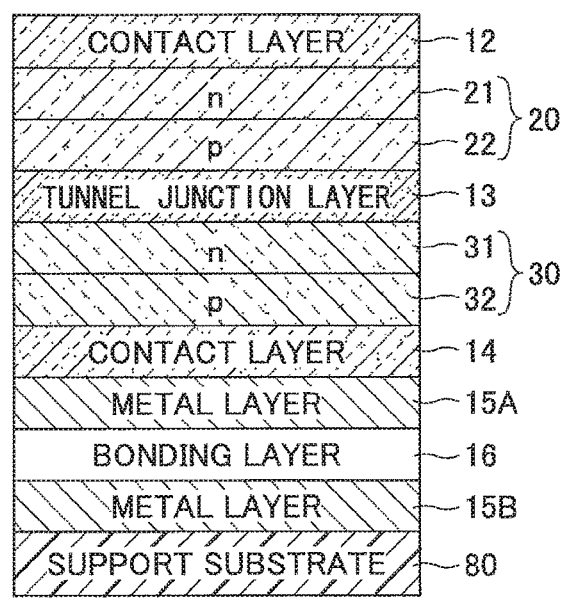

Next, the Si substrate 10 is removed from the layered body 100B by etching the Si substrate 10 and the buffer layer 11 of the layered body 100B illustrated in FIG. 2A. Accordingly, a layered body 100C as illustrated in FIG. 2B is formed. The layered body 100C is formed by removing the Si substrate 10 and the buffer layer 11 from the layered body 100B illustrated in FIG. 2A.

The etching of the Si substrate 10 and the buffer layer 11 is performed, for example, by a wet etching process using an etching solution including hydrofluoric acid, nitric acid, or acetic acid. The etching solution may be a mixed solution including hydrofluoric acid, nitric acid, and acetic acid. The composition of the etching solution may be appropriately determined according to the composition ratio of Si and Ge included in the buffer layer 11.

Note that the etching solution does not dissolve the contact layer 12 (GaAs layer), the GaInP cell 20, the tunnel junction layer 13 (AlGaAs/GaInP), the GaAs cell 30, the contact layer 14, the metal layer 15A, the bonding layer 16, the metal layer 15B, or the support substrate 80. Thus, the wet etching can be performed on the Si substrate 10 and the buffer layer 11 by impregnating the layered body 100B in the etching solution.

Note that the etching is to be performed by, for example, protecting, with a protective layer, the side surfaces of the Si substrate 10, the buffer layer 11, the contact layer 12, the GaInP cell 20, the tunnel junction layer 13, the GaAs cell 30, the contact layer 14, the metal layer 15A, the bonding layer 16, the metal layer 15B, and the support substrate 80, and the surface of the support substrate 80 (bottom surface in FIG. 2A). A protective layer will not be used when there is no need for protection in the above etching process.

Furthermore, in this case, a description is given of an embodiment in which both the Si substrate 10 and the buffer layer 11 are removed by etching. However, by removing the buffer layer 11 with the use of a solution for selectively etching only the buffer layer 11, the Si substrate 10 may be removed from the layered body 100B. As such an etching solution, for example, a nitrohydrofluoric acid solution (a mixed solution of hydrofluoric acid and nitric acid) may be used. Note that water may be added to the nitrohydrofluoric acid solution to dilute the solution.

Lastly, a metal layer 17 is formed on the top surface of the contact layer 12 of the layered body 100C. The metal layer 17 is formed on part of the top surface of the contact layer 12. This is because the metal layer 17 becomes the top electrode of the photovoltaic cell.

The metal layer 17 may be formed by, for example, a lift off method. The metal layer 17 is formed by forming a resist on the top surface of the contact layer 12 illustrated in FIG. 2B, in areas other than the area where the metal layer 17 illustrated in FIG. 3 is to be formed, vapor-depositing metal such as Au or Ag from above the resist, and then removing the resist.

Figure 3:
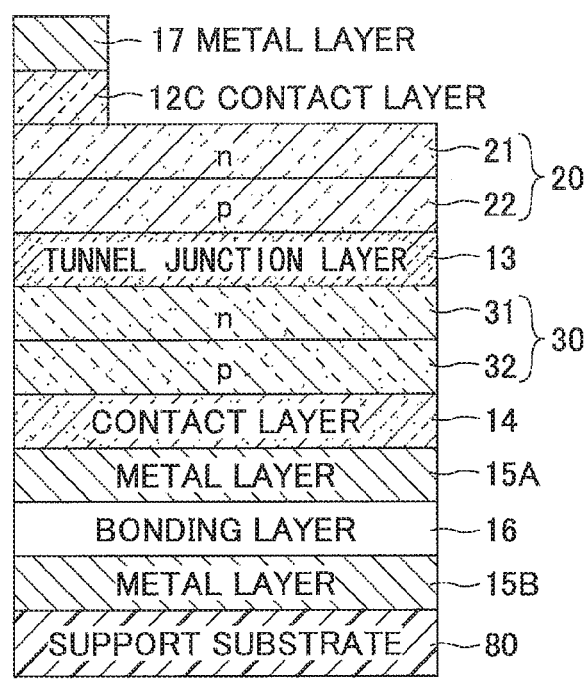
FIG. 3 illustrates the photovoltaic cell manufacturing method according to the first embodiment.

Note that a contact layer 12C illustrated in FIG. 3 is formed by forming the metal layer 17 (see FIG. 3) on the top surface of the contact layer 12 illustrated in FIG. 2B, and then using this metal layer 17 as a mask in removing parts of the contact layer 12 (see FIG. 2B) other than the part positioned immediately below the metal layer 17.

The contact layer 12C may be made by, for example, using a mixed liquid including sulfuric acid ($H_2SO_4$), hydrogen peroxide ($H_2O_2$), and water ($H_2O$), as the wet etching solution. The mixed liquid including sulfuric acid ($H_2SO_4$), hydrogen peroxide ($H_2O_2$), and water ($H_2O$) does not dissolve the GaInP in the GaInP cell 20, and therefore the wet etching process can be stopped at the GaInP cell 20.

According to the above, a layered body 100D illustrated in FIG. 3 can be produced. The layered body 100D is a photovoltaic cell including two photoelectric conversion cells, i.e., the GaInP cell 20 (1.9 eV) and the GaAs cell 30 (1.4 eV). That is to say, the layered body 100D is a photovoltaic cell made of a compound semiconductor.

In the layered body 100D, the buffer layer 11 is an example of a first buffer layer, and the GaInP cell 20 and the GaAs cell 30 are examples of a first photoelectric conversion cell. Furthermore, the layered body 100B illustrated in FIG. 2B is an example of a first layered body, and the Si substrate 10 is an example of a first silicon substrate. The first photoelectric conversion cell is a multi-junction cell in which two photoelectric conversion cells are stacked in series with each other in the stack direction. The multi-junction cell may include three or more photoelectric conversion cells that are stacked in series with each other in the stack direction.

According to the photovoltaic cell manufacturing method according to the first embodiment described above, the layered body 100B (see FIG. 2A) is produced by forming the buffer layer 11 on the Si substrate 10, and forming the contact layer 12, the GaInP cell 20, the tunnel junction layer 13, the GaAs cell 30, and the contact layer 14, on the buffer layer 11.

Then, after removing the Si substrate 10 and the buffer layer 11 from the layered body 100B, the metal layer 17 is formed on the contact layer 12, and the contact layer 12C is formed from the contact layer 12.

That is to say, by the photovoltaic cell manufacturing method according to the first embodiment, the buffer layer 11 for relaxing the difference in the lattice constant of silicon and the compound semiconductor layer, is formed on the inexpensive Si substrate 10, so that the GaInP cell 20, the tunnel junction layer 13, the GaAs cell 30, and the contact layer 14 can be formed on the Si substrate 10.

Then, in the manufacturing process, the buffer layer 11 and the Si substrate 10 are removed from the layered body 100B (see FIG. 2A) by wet etching.

Accordingly, a photovoltaic cell (layered body 100D) made of a compound semiconductor can be manufactured at a low cost.

Furthermore, an anti-reflection film may be formed at the light incident surface (the part not covered by the contact layer 12C or the metal layer 17) on the top surface of the GaInP cell 20 of the photovoltaic cell (layered body 100D) illustrated in FIG. 3.

Note that in the above description, as the buffer layer 11, a layer having a two layer structure including a SiGe layer and a Ge layer is used, or a SiGe layer in which the ratio of Ge increases as the distance from the surface of the Si substrate 10 increases, is used.

However, the buffer layer 11 may be formed by directly depositing a Ge layer on the Si substrate 10 by a CVD method, causing a defect in the Ge layer by performing a thermal cycling process (TCA) so that a structure that relaxes the difference in the lattice constant of Si and Ge is formed in the Ge layer, and performing a flattening process on the surface of the Ge layer. On such a buffer layer 11, a wet etching process may be performed by using an etching solution including hydrofluoric acid, nitric acid, or acetic acid.

Furthermore, as a different method, after growing a GaAs layer on the Si substrate 10, TCA is performed, and then a strained super lattice layer such as GaInAs/GaAs or GaInAs/GaPAs is grown, to be used as the buffer layer 11.

The buffer layer 11 formed with such a strained super lattice layer is subjected to etching with the use of a mixed liquid including sulfuric acid ($H_2SO_4$), hydrogen peroxide ($H_2O_2$), and water ($H_2O$), and therefore a GaInP-layer is to be formed as an etching stop-layer at the boundary between the buffer layer 11 and the contact layer 12.

The GaInP-layer is not dissolved by a mixed liquid including sulfuric acid ($H_2SO_4$), hydrogen peroxide ($H_2O_2$), and water ($H_2O$), and therefore the etching of the strained super lattice layer can be stopped at the GaInP-layer. Then, the GaInP-layer can be etched by a mixed liquid of hydrochloric acid (HCl) and water ($H_2O$). The contact layer 12 (GaAs) is not dissolved by a mixed liquid of hydrochloric acid (HCl) and water ($H_2O$), and therefore the GaInP-layer acting as the etching stop-layer can be selectively removed.

Furthermore, the buffer layer 11 may have a composition other than the above. The buffer layer 11 may have any other composition, as long as lattice relaxation occurs according to the inconsistency in the lattice among the Si substrate 10, the contact layer 12, the GaInP cell 20, the tunnel junction layer 13, the GaAs cell 30, and the contact layer 14. By generating a dislocation in the buffer layer 11, a photovoltaic cell made of a compound semiconductor having high quality with less dislocation, can be formed on the buffer layer 11.

Furthermore, the support substrate 80 may be a glass substrate and a Si substrate, instead of a film made of plastic.

Furthermore, in the above description, the photovoltaic cell is a double-junction photovoltaic cell including the GaInP cell 20 (1.9 eV) and the GaAs cell 30 (1.4 eV); however, a triple-junction photovoltaic cell formed by adding a cell having a band gap of 1.0 eV is even more preferable in terms of further improving the quantum efficiency.

As an example of a cell having a band gap of 1.0 eV, a GaInNAs(Sb) cell or a GaPAs/GaInAs super lattice cell may be used.

Furthermore, in the first embodiment, a GaAs lattice matching material is used; however, a Ge lattice matching material may be used. In this case, the lattice constant of the Ge lattice matching material is slightly higher than that of the GaAs lattice matching material, and therefore the composition of the Ge lattice matching material is to be appropriately adjusted. Note that instead of the GaAs cell 30, it is possible to use a cell made of GaInAs in which the composition of In is approximately 1%. The outermost surface of the buffer layer 11 is Ge, which can be made more easily.

Furthermore, the photovoltaic cell manufactured by the photovoltaic cell manufacturing method according to the first embodiment is not limited to a photovoltaic cell of a double-junction type or a triple-junction type. For example, a photovoltaic cell using a single-layered cell having a composition of a (Al)GaInP cell, a GaAs cell, a GaInAs cell, a GaInNAs(Sb) cell, a GaInPAs cell, an InP cell, an AlInAs cell, etc., may be manufactured. Furthermore, a photovoltaic cell of a quadruple-junction type or more may be manufactured.

According to the first embodiment described above, a photovoltaic cell made of a compound semiconductor can be formed by using the Si substrate 10, without using a compound semiconductor substrate, and a high-efficiency photovoltaic cell can be produced at a low cost.

Furthermore, the buffer layer 11 that performs lattice relaxation is removed at the manufacturing stage, and therefore the buffer layer 11 including many defects is not included in the final product of the photovoltaic cell (layered body 100D), and a photovoltaic cell having high efficiency and high reliability can be manufactured.

In the photovoltaic cell described in Non-patent Document 1, there is a possibility that the defects increase during operation and the efficiency deteriorates with time, and therefore the reliability may decrease.

Meanwhile, in the photovoltaic cell manufactured by the manufacturing method according to the first embodiment, the buffer layer 11 for relaxing the difference in the lattice constant does not remain in the final product of the photovoltaic cell, and therefore a photovoltaic cell having high reliability can be manufactured.

Furthermore, the Si substrate 10 is removed, and the photovoltaic cell (layered body 100D) is bonded together with the support substrate 80 made of a plastic film, and therefore a flexible and light-weight photovoltaic cell can be manufactured.

Note that (Al)GaInP encompasses both a composition including Al and a composition not including Al, and therefore Al is expressed as (Al). That is to say, (Al)GaInP is an expression including both AlGaInP and GaInP.

Similarly, GaInNAs(Sb) is an expression including both GaInNAsSb and GaInNAs. Ga(In)As is an expression including both GaInAs and GaAs. Furthermore, (Al)GaInP (As) is an expression including AlGaInP, GaInPAs, and GaInP. Furthermore, GaIn(P)As is an expression including GaInPAs and GaInAs.

Note that the Si substrate 10 and the buffer layer 11 may be removed by a method other than wet etching as described above. For example, a lift off method or a smart cut method may be performed, which includes selectively etching the AlAs by using an AlAs sacrifice layer, and separating the substrate from the cell part.

The lift off method is described in, for example, Proceedings of the 29th IEEE Photovoltaic Specialists Conference (2010) pp. 412-417. The smart cut method is often used for fabricating a SOI substrate, and is described in, for example, Applied Physics Letter 92, 103503 (2008).

Figure 4:
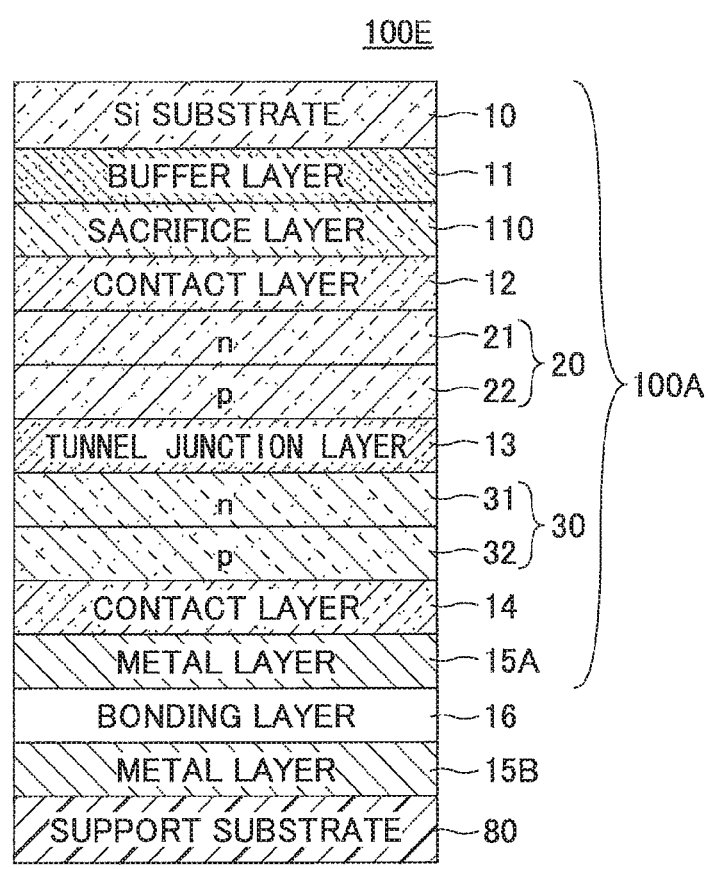
FIG. 4 illustrates a layered body according to a modification of the first embodiment, in which a Si substrate and a buffer layer are removed by a lift off method.

FIG. 4 illustrates a layered body 100E according to a modification of the first embodiment, in which the Si substrate 10 and the buffer layer 11 are removed by a lift off method.

As illustrated in FIG. 4, in a case where a lift off method is performed, in the layered body 100E, a sacrifice layer 110 constituted by, for example, an AlAs layer, is formed between the buffer layer 11 and the contact layer 12. Compared to the other materials, the AlAs layer has a significantly fast etching speed. Therefore, for example, by impregnating the AlAs layer in a sulfuric acid medicinal solution, the sacrifice layer 110 is selectively etched form the side surfaces, and the buffer layer 11 and the contact layer 12 are separated from each other. Accordingly, the Si substrate 10 and the buffer layer 11 can be removed.

Figure 5A:
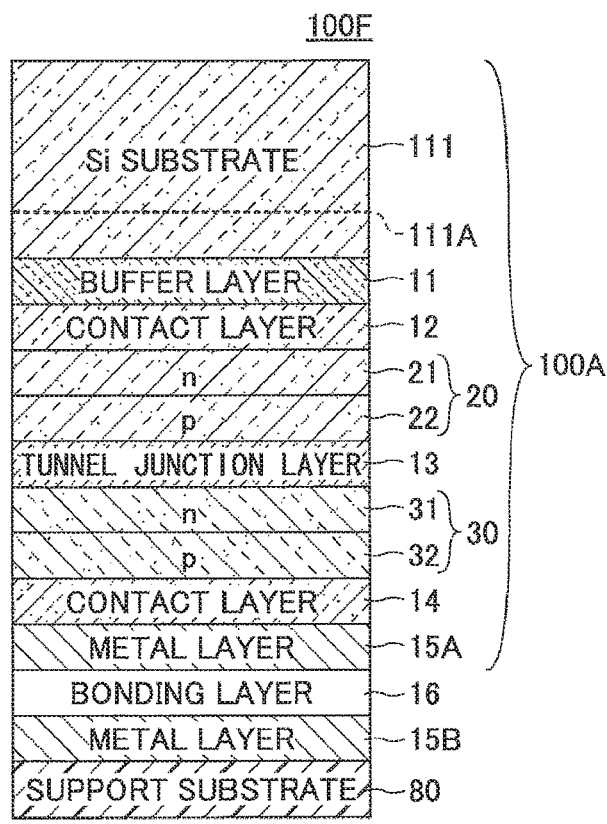
FIGS. 5A and 5B illustrate a smart cut method according to a modification of the first embodiment.
Figure 5B:
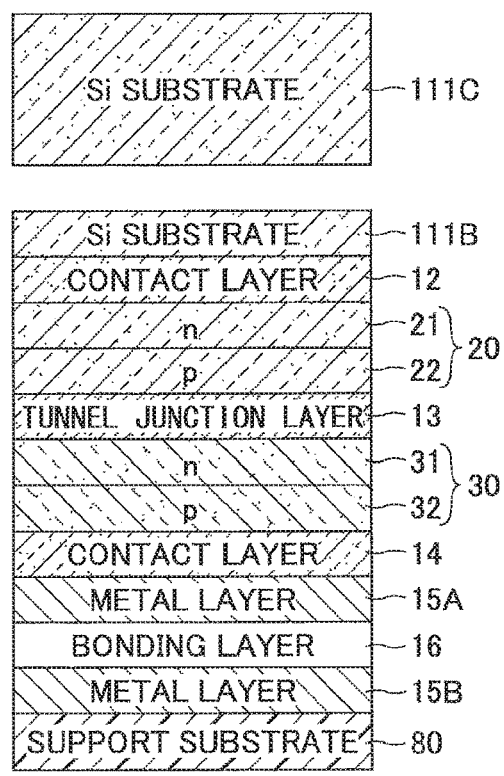

FIGS. 5A and 5B illustrate a smart cut method according to a modification of the first embodiment.

As illustrated in FIG. 5A, in a case where a smart cut method is performed, in a layered body 100F, a Si substrate 111 is included instead of the Si substrate 10 of the layered body 100B illustrated in FIG. 2A. In the smart cut method, before joining together the metal layer 15A and the metal layer 15B with the use of the bonding layer 16 (see FIG. 1B), an ion implanter is used to implant approximately $3.5E16$ ions/cm$^2$ through $1E17$ ions/cm$^2$ of hydrogen ions (H$^+$), into the Si substrate 111. After joining the metal layer 15A and the metal layer 15B with the use of the bonding layer 16, heat treatment is performed at approximately 400° C. through 600° C., so that peeling occurs at a hydrogen ion injection part 111A as illustrated in FIG. 5B, and the Si substrate 111 is separated into a thin Si layer 111B and a Si substrate 111C.

Subsequently, the Si layer 111B and the buffer layer 11 are removed by performing, for example, a wet etching process using an etching solution including hydrofluoric acid, nitric acid, and acetic acid.

In this case, the Si substrate 111C may be reused. This method may be performed in the same manner in the second through fourth embodiments described below.

Second Embodiment

A photovoltaic cell manufacturing method according to a second embodiment involves using, as a support substrate, a Si substrate on which a photoelectric conversion cell made of a silicon semiconductor is formed. In this case, the band gap of the photoelectric conversion cell made of a silicon semiconductor is 1.1 eV, and the band gap of the photoelectric conversion cell made of a compound semiconductor is 1.7 eV. Note that a GaInPAs cell is used as the photoelectric conversion cell made of a compound semiconductor.

FIGS. 6A through 7B illustrate a photovoltaic cell manufacturing method according to a second embodiment. In FIGS. 6A through 7B, the elements that are the same as those described in the first embodiment are denoted by the same reference numerals, and descriptions thereof are omitted or simplified.

Figures 6A, 6B:
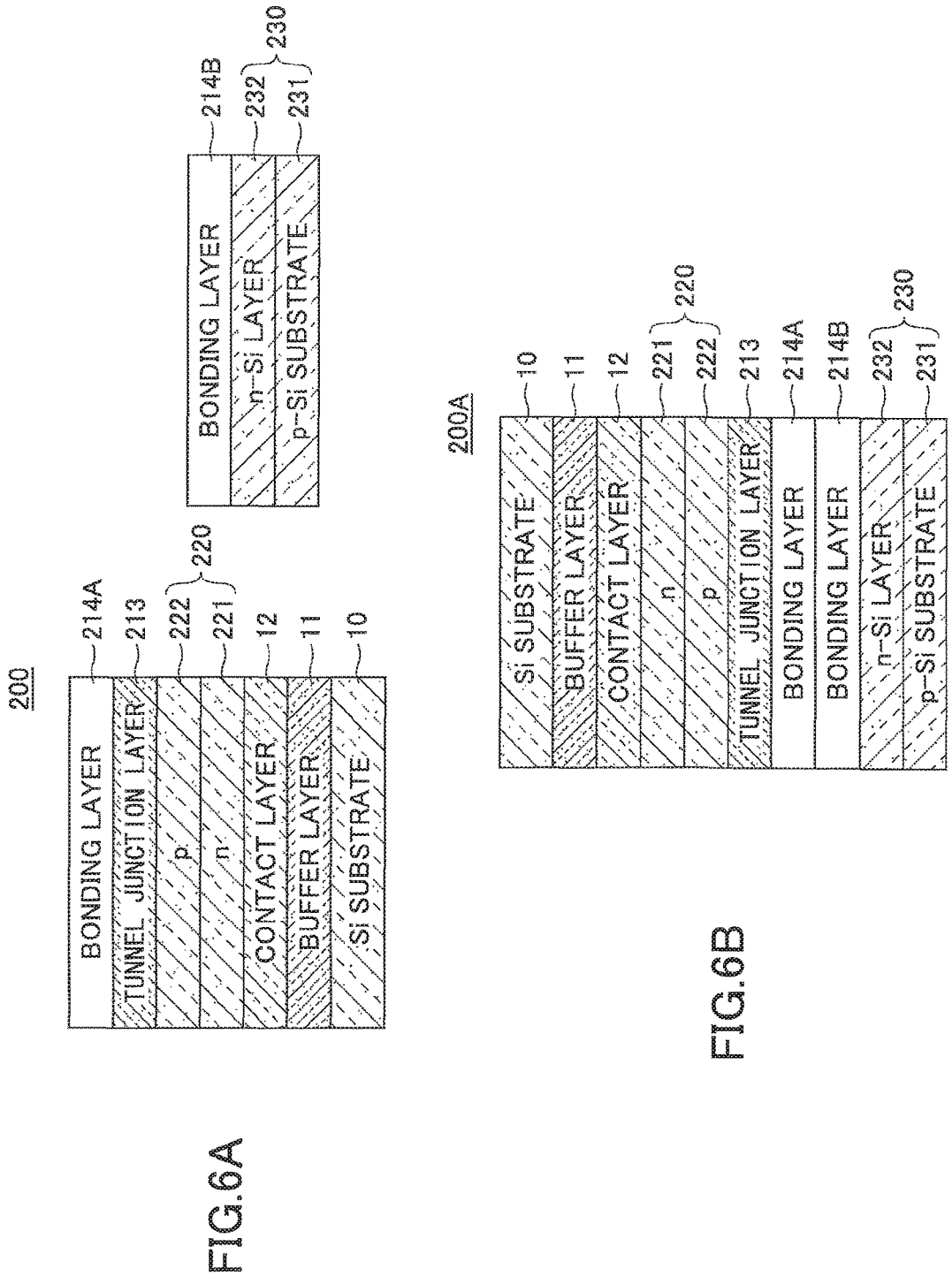
FIGS. 6A and 6B illustrate a photovoltaic cell manufacturing method according to a second embodiment.

First, as illustrated in FIG. 6A, the buffer layer 11, the contact layer 12, a GaInPAs cell 220, a tunnel junction layer 213, and a bonding layer 214A are sequentially formed on the Si substrate 10. In this case, a layered body 200 illustrated in FIG. 6A is made assuming that sunlight enters from the bottom side as viewed in FIG. 6A.

The GaInPAs cell 220 is a photoelectric conversion cell made of a compound semiconductor, including gallium (Ga), indium (In), phosphorus (P), and arsenic (As) as raw materials. The GaInPAs cell 220 includes an n-layer 221 and a p-layer 222. The GaInPAs cell 220 has substantially the same lattice constant as the Ge layer that is the topmost layer of the buffer layer 11 and the contact layer 12 (GaAs layer).

For example, the GaInPAs cell 220 is formed by a MOCVD method, by sequentially depositing the p-layer 221 and the p-layer 222 on the contact layer 12.

As the dopant of the n-layer 221, for example, silicon (Si) or selenium (Se) may be used. Furthermore, as the dopant of the p-layer 222, for example, zinc (Zn) or magnesium (Mg) may be used. In the second embodiment, the composition of Ga, In, P, and As is adjusted, so that the band gap of the GaInPAs cell 220 becomes 1.7 eV.

Furthermore, the GaInPAs cell 220 has a lattice constant that is significantly close to the lattice constant (approximately 5.65 Å) of the GaAs layer used as the contact layer 12. The composition of Ga, In, P, and As is adjusted so that the GaInPAs cell 220 can crystal-grow on the contact layer 12. The lattice constant of GaInPAs used as the GaInPAs cell 220 is substantially the same value as the lattice constant of GaAs.

Note that between the n-layer 221 and the contact layer 12 (incident side to the GaInPAs cell 220), a window layer having a wider gap than that of the GaInPAs cell 220 may be formed. Furthermore, above the p-layer 222 (between the p-layer 22 and the tunnel junction layer 213), a BSF (Back Surface Field) layer having a wider gap than that of the GaInPAs cell 220 may be formed.

The tunnel junction layer 213 is provided between the GaInPAs cell 220 and the bonding layer 214A, and includes an n-layer and p-layer that have been doped at a higher density than that of the n-layer 221 and the p-layer 222 of the GaInPAs cell 220 and an n-Si layer 232 and a p-Si layer 231 of a silicon cell 230 described below. The tunnel junction layer 213 is a junction layer, which is provided so that a current flows between the p-layer 222 of the GaInPAs cell 220 and the n-Si layer 232 of the silicon cell 230 (by tunnel junction).

For example, the tunnel junction layer 213 includes an AlGaAs layer (p-layer) and a GaInP-layer (n-layer), or a p-layer and an n-layer formed by a GaAs layer. For example, the tunnel junction layer 213 is formed by a MOCVD method, by sequentially depositing a p-layer and an n-layer on the surface of the GaInPAs cell 220 in the state order.

Note that the tunnel junction layer 213 has a lattice constant that is significantly close to the lattice constant of the GaInPAs cell 220 (approximately 5.65 Å). The composition is adjusted so that the tunnel junction layer 213 can crystal-grow on the GaInPAs cell 220.

The bonding layer 214A is mainly a layer to be deposited on the tunnel junction layer 213 for reducing the resistance between the GaInPAs cell 220 and the silicon cell 230. For example, an n type gallium arsenide (n-GaAs) layer is used. The n-GaAs layer acting as the bonding layer 214A may be formed on the tunnel junction layer 213 by, for example, a MOCVD method. As the dopant for making the layer a n type, for example, silicon (Si), selenium (Se), or tellurium (Te) may be used.

Note that the bonding layer 214A has a lattice constant that is significantly close to the lattice constant of the tunnel junction layer 213 and the GaInPAs cell 220 (approximately 5.65 Å). The composition is adjusted so that the bonding layer 214A can crystal-grow on the tunnel junction layer 213.

As described above, the layered body 200 illustrated in FIG. 6A is formed by sequentially depositing, on the Si substrate 10 and the buffer layer 11, the contact layer 12 that constitutes the light incident side, the GaInPAs cell 220, the tunnel junction layer 213, and the bonding layer 214A, in the stated order.

Furthermore, as illustrated in FIG. 6A, apart from the layered body 200, a bonding layer 214B is formed on the top surface of the silicon cell 230. In this case, the silicon cell 230 includes a p type Si substrate (p-Si substrate) 231 and an n type silicon (n-Si) layer 232.

The n-Si layer 232 is formed by mixing impurities such as phosphorus (P) from one side of the p-Si layer 231 (top side as viewed in FIG. 6A) and causing crystal-growth. The silicon cell 230 is a photoelectric conversion cell made of a silicon semiconductor.

Note that the n-Si layer 232 may be formed by implanting impurities such as phosphorus (P) from one side of the p-Si layer 231 (top side as viewed in FIG. 6A).

The bonding layer 214B is mainly a layer to be deposited on the silicon cell 230 for reducing the resistance between the GaInPAs cell 220 and the silicon cell 230. For example, an n type silicon-layer (n-Si layer) is used. The n-Si layer acting as the bonding layer 214B may be formed by mixing impurities such as phosphorus (P) from the top side of the n-Si layer 232 and causing crystal-growth. The n-Si layer acting as the bonding layer 214B may be the same as the n-Si layer 232; however, the n-Si layer acting as the bonding layer 214B preferably has a higher density than that of the n-Si layer 232.

Next, as illustrated in FIG. 6B, the layered body 200 is turned upside down in a state opposite to that illustrated in FIG. 6A, and the bonding layer 214A of the layered body 200 and the bonding layer 214B on the top surface of the silicon cell 230 are bonded together.

In this joining process, a cleaning process and a surface activation process are performed on the surfaces of the bonding layer 214A of the layered body 200 and the bonding layer 214B on the top surface of the silicon cell 230, to directly join together the bonding layer 214A and the bonding layer 214B. Note that the surface activation process may be performed by a nitrogen (N$_2$) plasma process, and the joining process may be performed, for example, in a state where the bonding layer 214A and the bonding layer 214B are heated to 150° C. in a vacuum atmosphere.

In this case, the layered body obtained by stacking the layered body 200 and the silicon cell 230 as illustrated in FIG. 6B, is referred to as a layered body 200A.

Figure 7A:
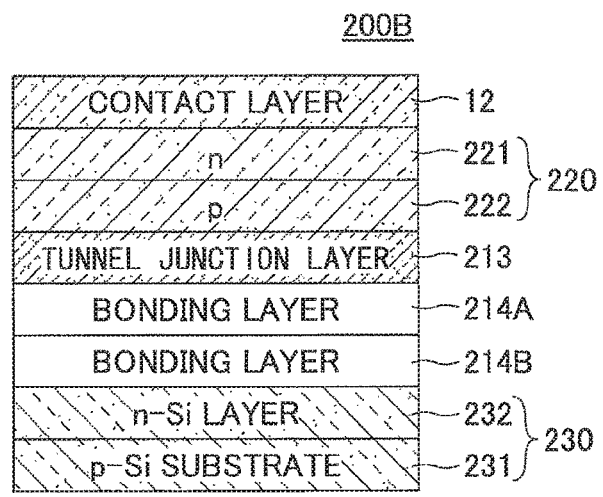
FIGS. 7A and 7B illustrate the photovoltaic cell manufacturing method according to the second embodiment.

Next, the Si substrate 10 and the buffer layer 11 are removed from the layered body 200A by etching the Si substrate 10 and the buffer layer 11 of the layered body 200A illustrated in FIG. 6B, so that a layered body 200B illustrated in FIG. 7A is obtained. The layered body 200B is formed by removing the Si substrate 10 and the buffer layer 11 from the layered body 200A illustrated in FIG. 6B.

The etching of the Si substrate 10 and the buffer layer 11 is performed, for example, by a wet etching process using an etching solution including hydrofluoric acid, nitric acid, or acetic acid, similar to the first embodiment.

Note that the above etching solution does not dissolve the contact layer 12 (GaAs layer), the GaInPAs cell 220, the tunnel junction layer 213 (AlGaAs/GaInP, or GaAs), the bonding layer 214A (GaAs layer), or the bonding layer 214B (GaAs layer). However, the above etching solution dissolves the silicon cell 230.

Thus, the etching is to be performed by protecting, with a protective layer, the side surfaces of the Si substrate 10, the buffer layer 11, the contact layer 12, the GaInPAs cell 220, the tunnel junction layer 213, the bonding layer 214A, the bonding layer 214B, and the silicon cell 230, and the surface of the silicon cell 230 (bottom surface in FIG. 6A), and then impregnating the layered body 200A in the etching solution. A protective layer will not be used when there is no need for protection in the above etching process.

Furthermore, in this case, a description is given of an embodiment in which both the Si substrate 10 and the buffer layer 11 are removed by etching. However, by removing the buffer layer 11 with the use of a solution for selectively etching only the buffer layer 11, the Si substrate 10 may be removed from the layered body 200B. As such an etching solution, for example, a nitrohydrofluoric acid solution (a mixed solution of hydrofluoric acid and nitric acid) may be used. Note that water may be added to the nitrohydrofluoric acid solution to dilute the solution.

Figure 7B:
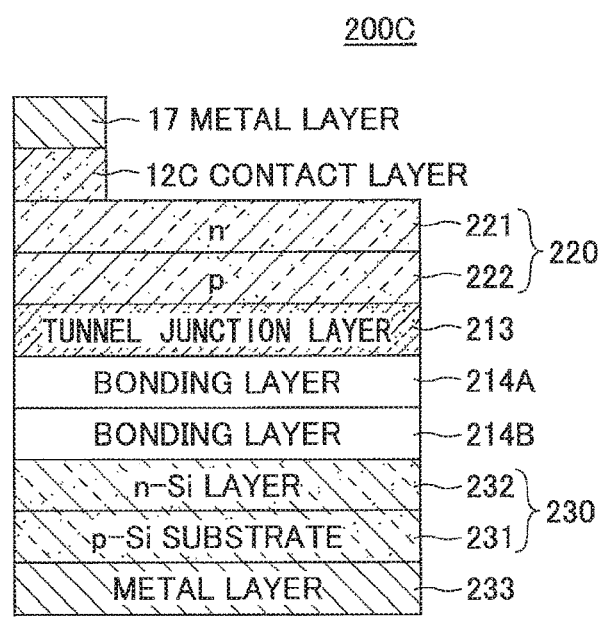

Lastly, as illustrated in FIG. 7B, the metal layer 17 is formed on the top surface of the contact layer 12 of the layered body 200B illustrated in FIG. 7A, and a metal layer 233 is formed on the bottom surface of the p-Si layer 231. Similar to the metal layer 17, the metal layer 233 can be formed by vapor-depositing metal such as Au or Ag on the bottom surface of the p-Si layer 231. The metal layer 233 is the bottom electrode of the photovoltaic cell (layered body 200C) according to the second embodiment.

Furthermore, the contact layer 12C illustrated in FIG. 7B is the same as the contact layer 12C of the first embodiment, which is formed by forming the metal layer 17 (see FIG. 7B) on the top surface of the contact layer 12 illustrated in FIG. 7A, and then using this metal layer 17 as a mask in removing parts of the contact layer 12 (see FIG. 7A) other than the part positioned immediately below the metal layer 17.

The contact layer 12C may be made by, for example, using a mixed liquid including sulfuric acid ($H_2SO_4$), hydrogen peroxide ($H_2O_2$), and water ($H_2O$), as the wet etching solution. The mixed liquid including sulfuric acid ($H_2SO_4$), hydrogen peroxide ($H_2O_2$), and water ($H_2O$) does not dissolve the GaInP in the GaInPAs cell 220, and therefore the wet etching process can be stopped at the GaInPAs cell 220.

According to the above, a layered body 200C illustrated in FIG. 7B can be produced. The layered body 200C is a photovoltaic cell including two photoelectric conversion cells, i.e., the GaInPAs cell 220 (1.7 eV) and the silicon cell 230 (1.1 eV). That is to say, the layered body 200C is a double-junction photovoltaic cell including a photoelectric conversion cell made of a compound semiconductor and a photoelectric conversion cell made of a silicon semiconductor.

In the layered body 200C, the buffer layer 11 is an example of a first buffer layer, and the GaInPAs cell 220 is an example of a first photoelectric conversion cell. Furthermore, the layered body 200A illustrated in FIG. 6B is an example of a first layered body, and the Si substrate 10 is an example of a first silicon substrate. Furthermore, the silicon cell 230 is an example of a photoelectric conversion cell made of a silicon semiconductor.

According to the photovoltaic cell manufacturing method according to the second embodiment described above, the GaInPAs cell 220 (1.7 eV) having a wide band gap is disposed closer to the light incident side, than the silicon cell 230 (1.1 eV). This is to absorb the short wavelength light at the GaInPAs cell 220 on the light incident side, and to absorb the light having a relatively long wavelength that has been transmitted through the GaInPAs cell 220, at the silicon cell 230.

The energy conversion efficiency of a double-junction photovoltaic cell including 1.7 eV/1.1 eV is estimated to be about the same level as that of a triple-junction photovoltaic cell including 1.9 eV/1.4 eV/0.67 eV (see, for example, The Japan Society of Applied Physics Autumn proceedings, 2010, 15p-NC-4).

In consideration of the carrier at the junction interface, the measures for loss of light, and the ease of current matching, the double-junction photovoltaic cell is more practical than the triple-junction photovoltaic cell.

According to the photovoltaic cell manufacturing method according to the second embodiment described above, the layered body 200 (see FIG. 6A) is made by forming the buffer layer 11 on the inexpensive Si substrate 10, and forming the contact layer 12, the GaInPAs cell 220, the tunnel junction layer 213, and the bonding layer 214A, on the buffer layer 11.

Furthermore, the bonding layer 214A of the layered body 200 and the bonding layer 214B formed on the top surface of the silicon cell 230 are bonded together, so that the layered body 200A (see FIG. 6B) including the GaInPAs cell 220 and the silicon cell 230 is made.

Then, after removing the Si substrate 10 and the buffer layer 11 from the layered body 200A and obtaining the layered body 200B (see FIG. 7A), the metal layer 17 is formed on the contact layer 12 of the layered body 200B. Furthermore, the contact layer 12C is formed from the contact layer 12, thereby fabricating the photovoltaic cell according to the second embodiment (layered body 200C, see FIG. 7B).

That is to say, by the photovoltaic cell manufacturing method according to the second embodiment, a photovoltaic cell including a photoelectric conversion cell made of a compound semiconductor can be produced without using a compound semiconductor substrate. Therefore, by the photovoltaic cell manufacturing method according to the second embodiment, a high-efficiency photovoltaic cell can be produced at a low cost.

Furthermore, the buffer layer 11, which realizes lattice relaxation for cancelling out the inconsistency in the lattice constant between the Si substrate 10 and the photovoltaic cell made of a compound semiconductor, is removed, and is not included in the final product of the photovoltaic cell (layered body 200C). Therefore, a photovoltaic cell (layered body 200C) having high reliability can be provided.

In the photovoltaic cell manufactured by the manufacturing method according to the second embodiment, the buffer layer 11 that relaxes the difference in the lattice constant does not remain in the final product of the photovoltaic cell, and therefore a photovoltaic cell having higher reliability than the photovoltaic cell described in Non-patent Document 1 can be manufactured.

Furthermore, according to the photovoltaic cell manufacturing method according to the second embodiment, a photovoltaic cell (layered body 200C) with which high efficiency can be attained by a double-junction structure, can be easily manufactured.

Note that an anti-reflection film may be formed at the light incident surface (the part not covered by the contact layer 12C or the metal layer 17) on the top surface of the GaInPAs cell 220 of the photovoltaic cell (layered body 200C) illustrated in FIG. 7B.

Figure 8:
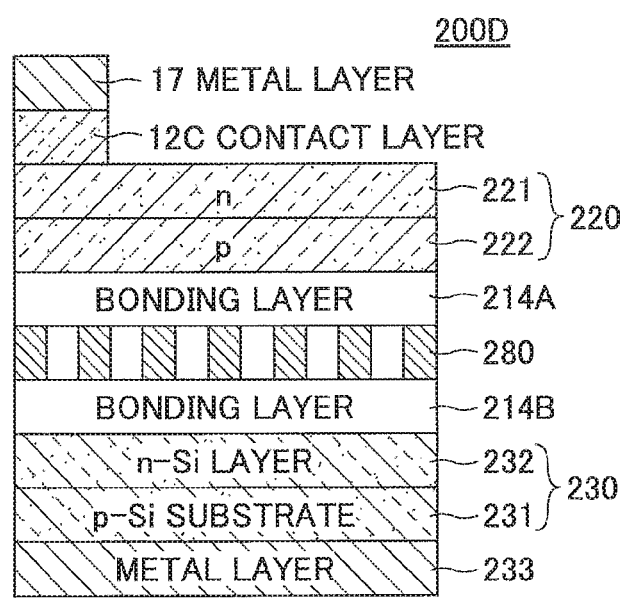
FIG. 8 is a cross-sectional view of a photovoltaic cell according to a modification of the second embodiment.

Furthermore, the photovoltaic cell according to the second embodiment may be modified as illustrated in FIG. 8.

FIG. 8 is a cross-sectional view of a photovoltaic cell according to a modification of the second embodiment.

A photovoltaic cell 200D illustrated in FIG. 8 does not include the tunnel junction layer 213 illustrated in FIG. 7B, and the bonding layer 214A and the bonding layer 214B are mechanically connected by a fixing member 280. As the fixing member 280, for example, a Palladium (Pd) Nanoparticle Array may be used.

The palladium nanoparticle array is for causing conductive nanoparticles to be self-arranged on the junction interface, with the use of the separation arrangement of a block copolymer. Nano arrangements of Pd, Au, Pt, Ag, etc., are possible. A diluted solution of a block copolymer is spin-coated, the block copolymer is caused to be self-arranged, and the block copolymer is exposed to an aqueous solution including metal ions such as $Pd^{2+}$ (palladium ions), so that metal ions are selectively formed in the block copolymer. Then, Ar (argon) plasma is radiated, so that the block copolymer template is removed, and a nanoparticle array which is self-arranged, is formed. Light is transmitted through parts without nanoparticles. By using a palladium nanoparticle array, light that has been transmitted through the GaInPAs cell 220 can be efficiently guided to the silicon cell 230.

In a state where a palladium nanoparticle array is formed on the bonding layer 214A or the bonding layer 214B, the bonding layer 214A and the bonding layer 214B are bonded together, so that a compound semiconductor photovoltaic cell is produced.

The fixing member 280 is an example of a fixing unit. As described above, the bonding method of mechanically superposing two layered bodies with the use of the fixing member 280 is referred to as mechanical stacking.

Note that the fixing member 280 is not limited to a palladium nanoparticle array; the fixing member 280 may be a nanoparticle array including other metals (for example, Au (gold), or other mechanical means.

As described above, in the photovoltaic cell according to the modification of the second embodiment, the bonding layer 214A and the bonding layer 214B are bonded by the fixing member 280, and therefore there is no need to provide the tunnel junction layer 213 (see FIG. 7B) between the GaInPAs cell 220 and the bonding layer 214A, whereas the GaInPAs cell 220 is directly bonded on top of the bonding layer 214A.

As described above, a layered body including the silicon cell 230 and the layered body including the GaInPAs cell 220 may be connected by mechanical stacking.

According to the second embodiment, the band gap of the photoelectric conversion cell made of the compound semiconductor is 1.7 eV as described above. However, the band gap of the photoelectric conversion cell made of the compound semiconductor may be 1.4 eV through 1.9 eV.

Third Embodiment

A photovoltaic cell manufacturing method according to a third embodiment is a method of manufacturing a quadruple-junction photovoltaic cell including four photoelectric conversion cells made of a compound semiconductor. In the photovoltaic cell according to the third embodiment, two of the four photoelectric conversion cells have a different lattice constant from that of the other two of the four photoelectric conversion cells. Thus, the quadruple-junction photovoltaic cell is manufactured by fabricating two photoelectric conversion cells on each of two Si substrates, and then joining the two Si substrates.

FIGS. 9A through 13 illustrate a photovoltaic cell manufacturing method according to the third embodiment. In FIGS. 9A through 13, the elements that are the same as those described in the first embodiment are denoted by the same reference numerals, and descriptions thereof are omitted or simplified.

Figure 9:
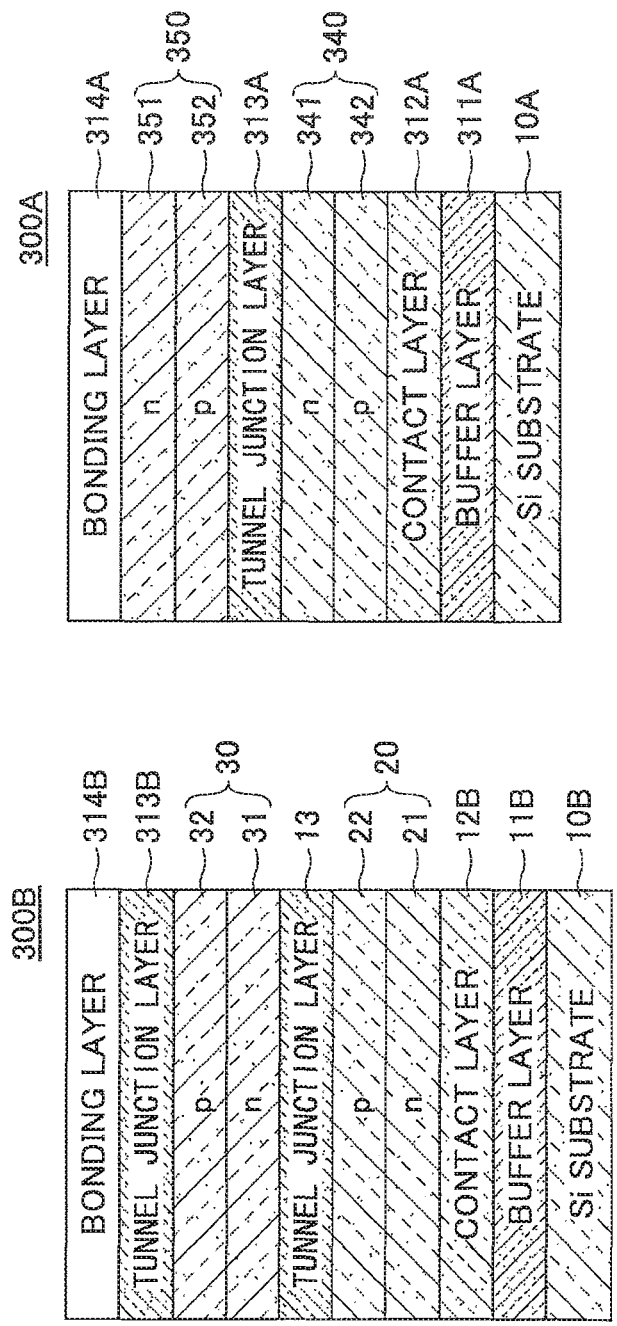
FIG. 9 illustrates a photovoltaic cell manufacturing method according to a third embodiment.

First, layered bodies 300A and 300B illustrated in FIG. 9 are made.

The layered body 300A is made by sequentially forming a buffer layer 311A, a contact layer 312A, a GaInAs cell 340, a tunnel junction layer 313A, a GaInPAs cell 350, and a bonding layer 314A, on a Si substrate 10A.

Furthermore, the layered body 300B is made by sequentially forming a buffer layer 11B, a contact layer 12B, a GaInP cell 20, a tunnel junction layer 13, a GaAs cell 30, a tunnel junction layer 313B, and a bonding layer 314B, on a Si substrate 10B.

The layered body 300A illustrated in FIG. 9 is made assuming that sunlight enters from the top side as viewed in FIG. 9, and the layered body 300B illustrated in FIG. 9 is made assuming that sunlight enters from the bottom side as viewed in FIG. 9.

First, a description is given of the layered body 300A. The Si substrate 10A included in the layered body 300A is the same as the Si substrate 10 of the first embodiment.

The buffer layer 311A is formed by directly depositing a Ge layer on the Si substrate 10A by a CVD method, and causing a defect in the Ge layer by performing a thermal cycling process (TCA) so that a structure that relaxes the difference in the lattice constant of Si and Ge is formed in the Ge layer. Subsequently, a flattening process is performed on the surface of the Ge layer.

Then, on the Ge layer on which the flattening layer has been performed, a GaAs layer is formed by a MOCVD method. Furthermore, on the GaAs layer, a composition sloped layer made of AlInAs is formed by a MOCVD method, so that further lattice relaxation is realized.

Specifically, as the composition sloped layer made of AlInAs, the composition ratio of In in the layer is gradually increased (in a sloped manner), from AlAs having a lattice constant that is substantially equal to that of GaAs, to AlInAs composition having a lattice constant that slightly exceeds that of InP. Then, the composition ratio of In is slightly reduced just before the topmost layer of the AlInAs composition sloped layer, so that the lattice constant of the AlInAs composition sloped layer is reduced to a lattice constant that is substantially equal to that of InP. Then, as the topmost layer of the composition sloped layer made of AlInAs, a layer having a fixed composition ratio of In is formed, by which approximately the same lattice constant as that of InP (approximately 5.87 Å) can be obtained.

That is to say, as the buffer layer 311A, a layer including a Ge layer, a GaAs layer, and a composition sloped layer made of AlInAs, is formed on the Si substrate 10A.

Furthermore, the contact layer 312A is formed by depositing a GaInAs layer by a MOCVD method on the buffer layer 311A. Note that the GaInAs layer formed as the contact layer 312A has a lattice constant that is significantly close to that of InP, and the composition of Ga, In, As is adjusted so that the GaInAs layer can crystal-grow on the buffer layer 311A.

The GaInAs cell 340 is a photoelectric conversion cell made of a compound semiconductor including gallium (Ga), indium (In), and arsenic (As) as raw materials, and the GaInAs cell 340 includes an n-layer 341 and a p-layer 342. For example, the GaInAs cell 340 is formed by sequentially depositing the p-layer 342 and the n-layer 341 on the contact layer 312A by a MOCVD method.

As the dopant of the n-layer 341, for example, silicon (Si) or selenium (Se) may be used. Furthermore, as the dopant of the p-layer 342, for example, zinc (Zn) or magnesium (Mg) may be used. In the third embodiment, the composition of Ga, In, As is adjusted, so that the band gap of the GaInAs cell 340 becomes 0.7 eV.

Note that the GaInAs cell 340 has a lattice constant that is significantly close to that of InP, and the composition of Ga, In, As is adjusted so that the GaInAs cell 340 can crystal-grow on the contact layer 312A.

Note that between the n-layer 341 and the tunnel junction layer 313A (incident side to the GaInAs cell 340), a window layer having a wider gap than that of the GaInAs cell 340 may be formed. Furthermore, below the p-layer 342 (between the p-layer 342 and the contact layer 312A), a BSF (Back Surface Field) layer having a wider gap than that of the GaInAs cell 340 may be formed.

The tunnel junction layer 313A is provided between the GaInAs cell 340 and the GaInPAs cell 350, and includes an n-layer and a p-layer that are doped by a higher density than that of the n-layer 341 and the p-layer 342 of the GaInAs cell 340, and a n-layer 351 and the p-layer 352 of the GaInPAs cell 350. The tunnel junction layer 313A is a junction layer which is provided so that a current flows between the p-layer 341 of the GaInAs cell 340 and the p-layer 352 of the GaInPAs cell 350 (by tunnel junction).

For example, the tunnel junction layer 313A is formed by depositing the n-layer and the p-layer of the AlGaInAs layer in the stated order on the surface of the GaInAs cell 340 by a MOCVD method.

Note that the tunnel junction layer 313A has a lattice constant that is significantly close to that of InP, and the composition of Al, Ga, In, As is adjusted so that the tunnel junction layer 313A can crystal-grow on the GaInAs cell 340.

The GaInPAs cell 350 is a photoelectric conversion cell made of a compound semiconductor, including gallium (Ga), indium (In), phosphorus (P), and arsenic (As) as raw materials. The GaInPAs cell 350 includes the n-layer 351 and the p-layer 352. For example, the GaInPAs cell 350 is formed by a MOCVD method, by sequentially depositing the p-layer 352 and the n-layer 351 on the tunnel junction layer 313A.

As the dopant of the n-layer 351, for example, silicon (Si) or selenium (Se) may be used. Furthermore, as the dopant of the p-layer 352, for example, zinc (Zn) or magnesium (Mg) may be used. In the third embodiment, the composition of Ga, In, P, and As is adjusted, so that the band gap of the GaInPAs cell 350 becomes 1.0 eV.

Note that the GaInPAs cell 350 has a lattice constant that is significantly close to that of InP, and the composition of Ga, In, P, and As is adjusted so that the GaInPAs cell 350 can crystal-grow on the tunnel junction layer 313A.

Note that between the n-layer 351 and the bonding layer 314A (incident side to the GaInPAs cell 350), a window layer having a wider gap than that of the GaInPAs cell 350 may be formed. Furthermore, below the p-layer 352 (between the p-layer 352 and the tunnel junction layer 313A), a BSF (Back Surface Field) layer having a wider gap than that of the GaInPAs cell 350 may be formed.

The bonding layer 314A is mainly a layer to be bonded with the bonding layer 314B to connect the layered body 300A and the layered body 300B, and a layer to be deposited on the GaInPAs cell 350 for reducing the resistance between the GaInPAs cell 350 of the layered body 300A and the GaAs cell 30 of the layered body 300B.

For example, as the bonding layer 314A, a thin n-InP-layer that has been doped at high density, is used. For example, the n-InP-layer used as the bonding layer 314A may be formed on the GaInPAs cell 350 by an MOCVD method.

Note that the bonding layer 314A has a lattice constant that is significantly close to the lattice constant of InP. The composition is adjusted so that the bonding layer 314A can crystal-grow on the GaInPAs cell 350.

As described above, the layered body 300A illustrated in FIG. 9 is formed by sequentially depositing, on the Si substrate 10A and the buffer layer 311A, the contact layer 312A that is at the far side with respect to the light incident direction, the GaInAs cell 340, the tunnel junction layer 313A, the GaInPAs cell 350, and the bonding layer 314A, in the stated order.

Accordingly, the GaInPAs cell 350 (1.0 eV) having a wide band gap is produced closer to the light incident side, than the GaInAs cell 340 (0.7 eV).

Note that in the third embodiment, the Si substrate 10A and the buffer layer 311A are examples of a first silicon substrate and a first buffer layer, respectively. The GaInAs cell 340 and the GaInPAs cell 350 are examples of a first photoelectric conversion cell, and are also examples of a cell formed with an InP lattice matching material. Furthermore, the bonding layer 314A is an example of a first joining layer.

Next, a description is given of the layered body 300B. In the layered body 300B, the Si substrate 10B, the buffer layer 11B, the contact layer 12B, the GaInP cell 20, the tunnel junction layer 13, and the GaAs cell 30, are the same as the Si substrate 10, the buffer layer 11, the contact layer 12, the GaInP cell 20, the tunnel junction layer 13, and the GaAs cell 30 of the first embodiment, respectively.

In the layered body 300B, the tunnel junction layer 313B and the bonding layer 314B are deposited on the GaAs cell 30.

The tunnel junction layer 313B is provided between the GaAs cell 30 and the bonding layer 314B, and includes an n-layer and a p-layer that are doped by a higher density than that of the n-layer 31 and the p-layer 32 of the GaAs cell 30. The tunnel junction layer 313B is a junction layer which is provided so that a current flows between the p-layer 32 of the GaAs cell 30 and the bonding layer 314B (by tunnel junction).

For example, the tunnel junction layer 313B includes a p-layer and an n-layer according to a GaAs layer. The tunnel junction layer 313B is formed by depositing the p-layer and the n-layer in the stated order on the surface of the GaAs cell 30 by a MOCVD method.

Note that the tunnel junction layer 313B has a lattice constant that is significantly close to that of the GaAs layer (approximately 5.65 Å), and the composition is adjusted so that the tunnel junction layer 313B can crystal-grow on the GaAs cell 30.

The bonding layer 314B is mainly a layer to be bonded with the bonding layer 314A to connect the layered body 300A and the layered body 300B, and a layer to be deposited on the tunnel junction layer 313B for reducing the resistance between the GaAs cell 30 and the tunnel junction layer 313B of the layered body 300B and the GaInPAs cell 350 of the layered body 300A.

For example, as the bonding layer 314B, an n type gallium arsenide (n-GaAs) layer is used. For example, the GaAs layer used as the bonding layer 314B may be formed on the tunnel junction layer 313B by a MOCVD method.

Note that the bonding layer 314B has a lattice constant that is significantly close to that of the GaAs layer (approximately 5.65 Å), and the composition is adjusted so that the bonding layer 314B can crystal-grow on the tunnel junction layer 313B.

Note that between the n-layer 21 of the GaInP cell 20 and the contact layer 12B (incident side to the GaInP cell 20), a window layer having a wider gap than that of the GaInP cell 20 may be formed. Furthermore, above the p-layer 22 (between the p-layer 22 and the tunnel junction layer 13), a BSF (Back Surface Field) layer having a wider gap than that of the GaInP cell 20 may be formed.

Note that between the n-layer 31 of the GaAs cell 30 and the tunnel junction layer 13 (incident side to the GaAs cell 30), a window layer having a wider gap than that of the GaAs cell 30 may be formed. Furthermore, above the p-layer 32 (between the p-layer 32 and the tunnel junction layer 313B), a BSF (Back Surface Field) layer having a wider gap than that of the GaAs cell 30 may be formed.

In the third embodiment, the Si substrate 10B and the buffer layer 11B are examples of a second silicon substrate and a second buffer layer, respectively. The GaInP cell 20 and the GaAs cell 30 are examples of a second photoelectric conversion cell, and are also examples of a cell formed with a GaAs lattice matching material. Furthermore, the bonding layer 314B is an example of a second joining layer.

Figure 10:
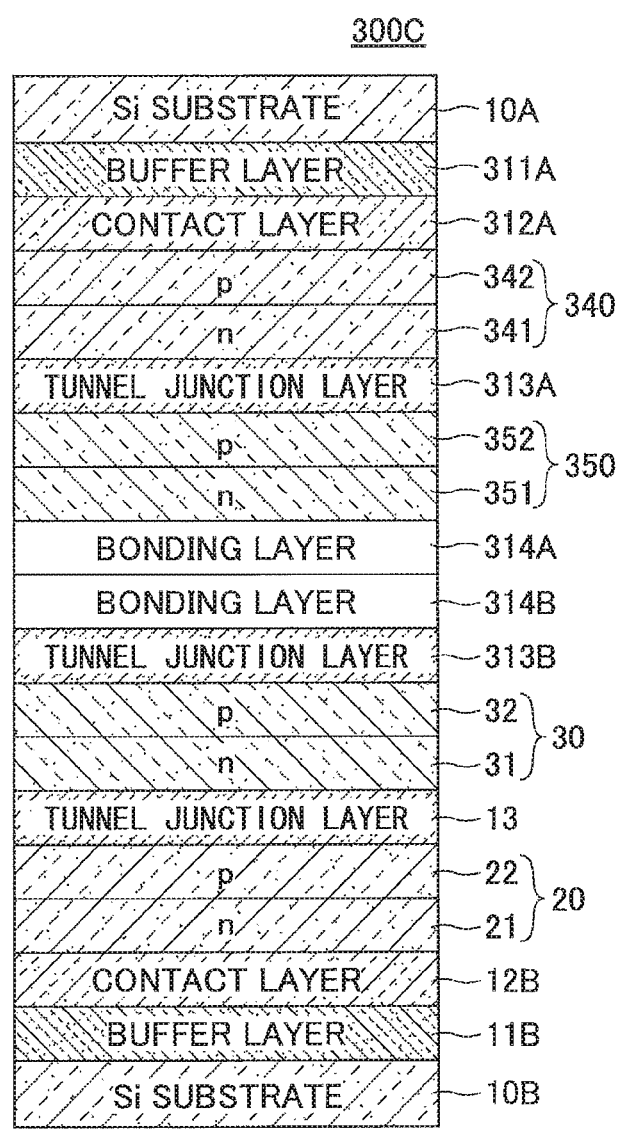
FIG. 10 illustrates the photovoltaic cell manufacturing method according to the third embodiment.

Next, as illustrated in FIG. 10, the layered body 300A is turned upside down, and the bonding layer 314A and the bonding layer 314B are bonded together, to directly join the layered body 300A with the layered body 300B. A layered body that is obtained by connecting the layered body 300A and the layered body 300B as illustrated in FIG. 10, is referred to as a layered body 300C. The layered body 300C is an example of a second layered body.

In this joining process, a cleaning process and a surface activation process are performed on the surfaces of the bonding layer 314A of the layered body 300A and the bonding layer 314B of the layered body 300B, to directly join together the bonding layer 314A and the bonding layer 314B. Note that the surface activation process may be performed by a nitrogen ($N_2$) plasma process, and the joining process may be performed, for example, in a state where the bonding layer 314A and the bonding layer 314B are heated to 150° C. in a vacuum.

Figure 11A:
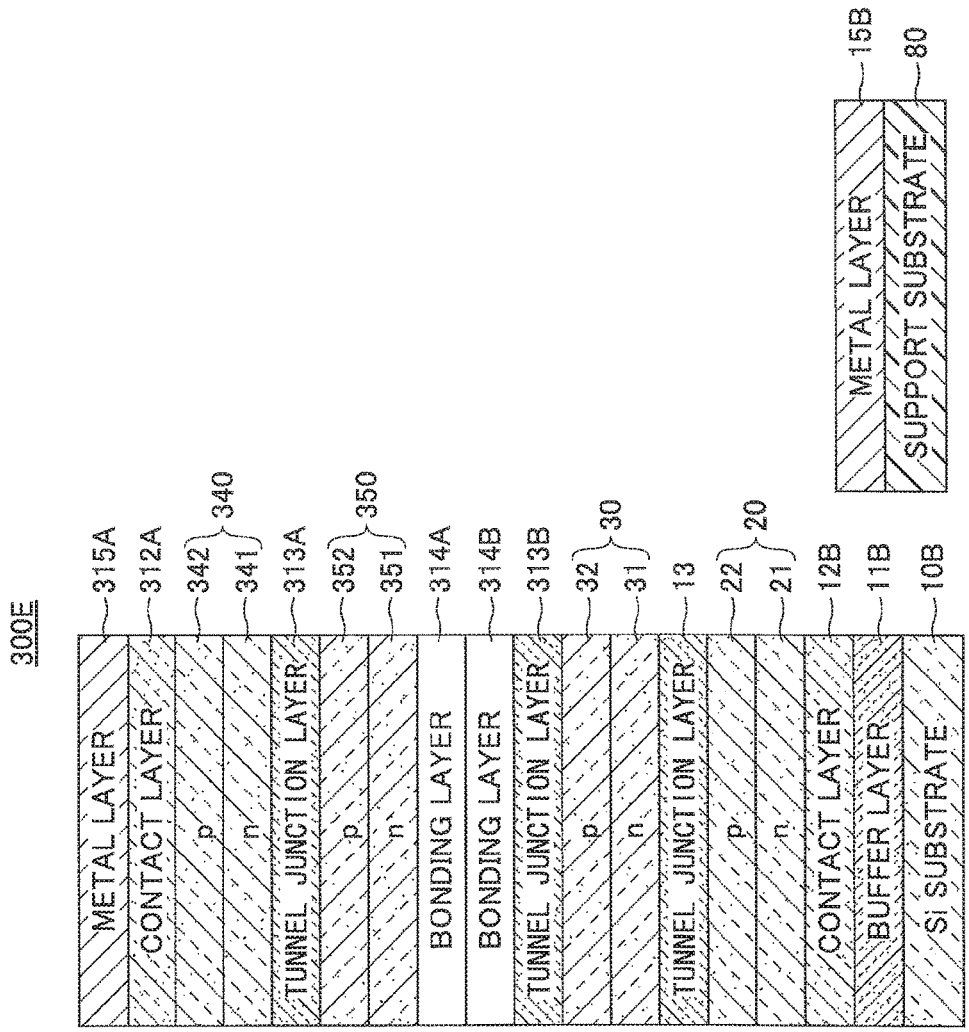
FIGS. 11A and 11B illustrate the photovoltaic cell manufacturing method according to the third embodiment.

Next, the Si substrate 10A and the buffer layer 311A are removed from the layered body 300C by etching the Si substrate 10A and the buffer layer 311A of the layered body 300C illustrated in FIG. 10, so that a layered body 300D illustrated in FIG. 11A is obtained. The layered body 300D is formed by removing the Si substrate 10A and the buffer layer 311A from the layered body 300C illustrated in FIG. 10.

The etching of the Si substrate 10A and the buffer layer 311A is performed by, for example, etching the Ge layers in the Si substrate 10A and the buffer layer 311A, with a mixed solution ($HF:HNO_3:CH_3COOH$ mixed solution) including hydrofluoric acid (HF), nitric acid ($HNO_3$), and acetic acid ($CH_3COOH$). Furthermore, the GaAs layer and the AlInAs composition sloped layer in the buffer layer 311A are to be etched with a mixed solution ($H_2SO_4:H_2O_2:H_2O$ mixed solution) including sulfuric acid ($H_2SO_4$), hydrogen peroxide ($H_2O_2$), and water ($H_2O$).

In this case, the mixed solution including sulfuric acid ($H_2SO_4$), hydrogen peroxide ($H_2O_2$), and water ($H_2O$) dissolves the GaInAs in the contact layer 312A, and therefore by providing an etching stop-layer such as a GaInP-layer between the buffer layer 311A and the contact layer 312A, the wet etching process can be stopped.

Note that the etching is to be performed by protecting, with a protective layer, the portions other than the surface of the Si substrate 10A of the layered body 300C (top surface as viewed in FIG. 10), and then impregnating the layered body 300C in the etching solution.

That is to say, the side surfaces of the Si substrate 10A, the buffer layer 311A, the contact layer 312A, the GaInAs cell 340, the tunnel junction layer 313A, the GaInPAs cell 350, the bonding layer 314A, the bonding layer 314B, the tunnel junction layer 313B, the GaAs cell 30, the tunnel junction layer 13, the GaInP cell 20, the contact layer 12B, the buffer layer 11B, the Si substrate 10B, and the surface of the Si substrate 10B (bottom surface as viewed in FIG. 10) are to be protected by a protective layer, and then the layered body 300C is to be impregnated in the etching solution. A protective layer will not be used when there is no need for protection in the above etching process.

Furthermore, in this case, a description is given of an embodiment in which both the Si substrate 10A and the buffer layer 311A are removed by etching. However, by removing the buffer layer 311A with the use of a solution for selectively etching only the buffer layer 311A, the Si substrate 10A may be removed from the layered body 300C. As such an etching solution, for example, a nitrohydrofluoric acid solution (a mixed solution of hydrofluoric acid and nitric acid) may be used. Note that water may be added to the nitrohydrofluoric acid solution to dilute the solution.

Figure 11B:
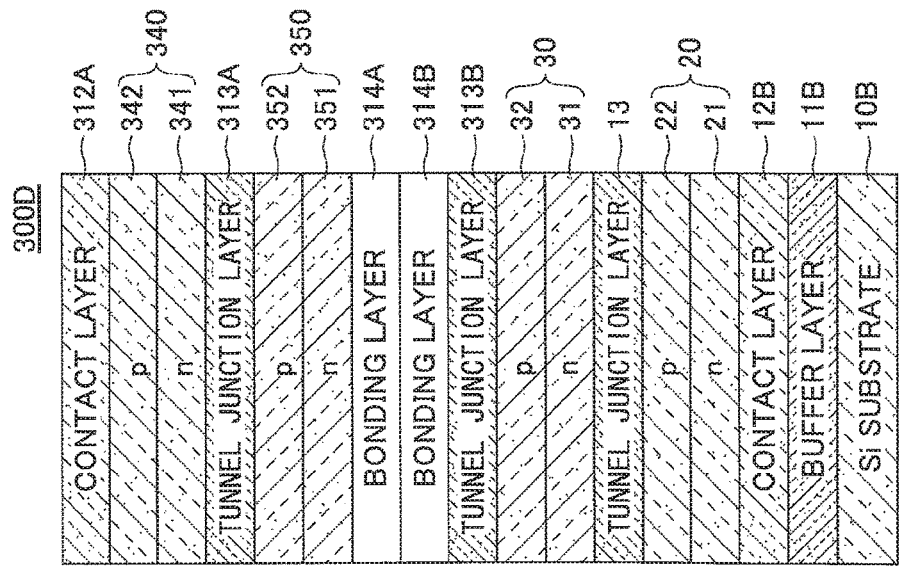

Next, as illustrated in FIG. 11B, a support substrate 80 is prepared, and a metal layer 315A is formed on the contact layer 312A of the layered body 300D (see FIG. 11A), and a metal layer 15B is formed on the support substrate 80.

The metal layers 315A, 15B are thin films made of a metal such as gold (Au) or silver (Ag), and may be formed by a vapor deposition method or a sputtering method. Furthermore, the support substrate 80 may be, for example, a film made of plastic.

Note that a layered body obtained by forming the metal layer 315A on the contact layer 312A of the layered body 300D (see FIG. 11A) as illustrated in FIG. 11B, is referred to as a layered body 300E. The layered body 300E is an example of a third layered body.

Figure 12A:
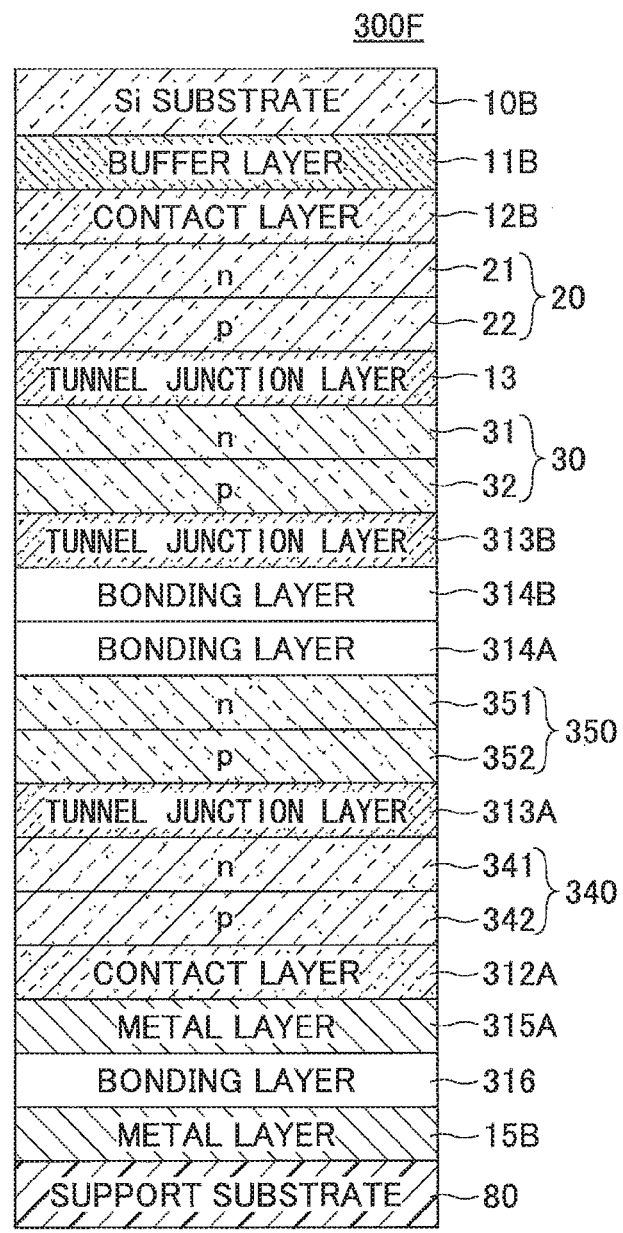
FIGS. 12A and 12B illustrate the photovoltaic cell manufacturing method according to the third embodiment.

Next, as illustrated in FIG. 12A, the layered body 300E (see FIG. 11B) is turned upside down, and a bonding layer 316 is used to join the metal layer 315A of the layered body 300E with the metal layer 15B formed on the surface of the support substrate 80.

The bonding layer 316 is the same as the bonding layer 16 of the first embodiment, and is formed by applying, on the surface of the metal layer 315A or the metal layer 15B, a joining material such as a conductive epoxy agent formed, for example, by including silver (Ag) nanoparticles in epoxy resin. The bonding layer 316 is formed by, for example, applying the joining material on the metal layer 315A or the metal layer 15B by screen printing.

A layered body 300F as illustrated in FIG. 12A is formed by joining together the metal layer 315A and the metal layer 15B by using the bonding layer 316 as described above. In this case, the bonding layer 316 is heated so that the metal layer 315A and the metal layer 15B are fused together by the bonding layer 316. The layered body 300F includes the layered body 300E (see FIG. 11B), the bonding layer 316, the metal layer 15B, and the support substrate 80.

Note that the metal layer 315A, the bonding layer 316, and the metal layer 15B are used as the bottom electrode (backside electrode) of the photovoltaic cell.

Figure 12B:
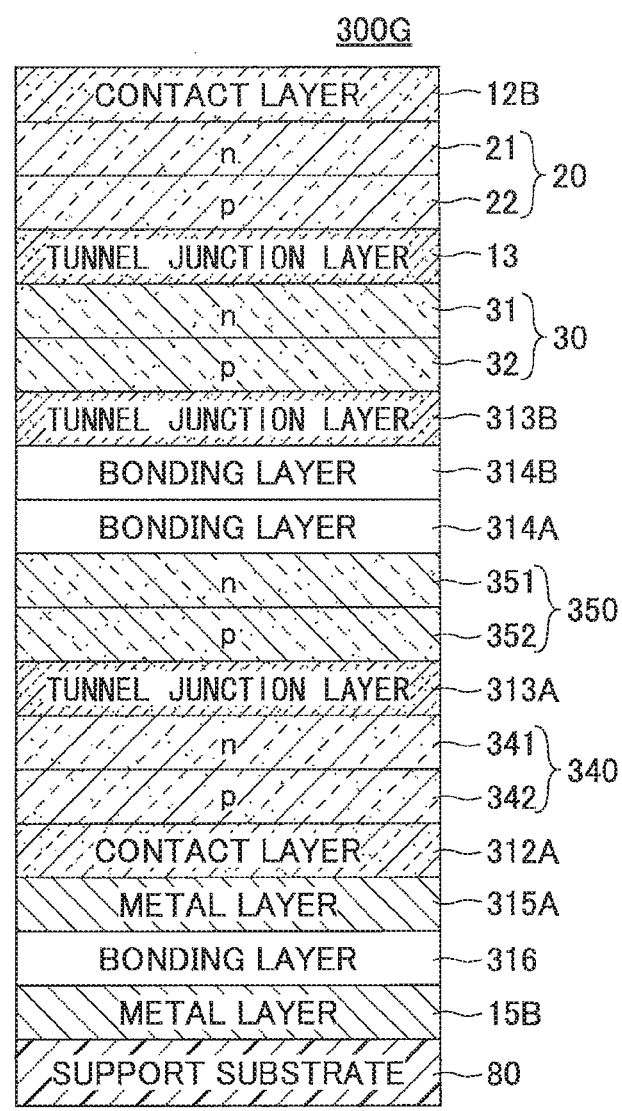

Next, the Si substrate 10B and the buffer layer 11B are removed from the layered body 300F by etching the Si substrate 10B and the buffer layer 11B of the layered body 300F illustrated in FIG. 12A. Accordingly, a layered body 300G as illustrated in FIG. 12B is formed. The layered body 300G is obtained by removing the Si substrate 10B and the buffer layer 11B from the layered body 300F illustrated in FIG. 12A.

The etching of the buffer layer 11B may be performed in the same manner as etching the buffer layer 11 of the first embodiment, for example, by a wet etching process using an etching solution including hydrofluoric acid, nitric acid, or acetic acid.

Note that the etching is to be performed by protecting, with a protective layer, the portions other than the surface of the Si substrate 10B of the layered body 300F (top surface as viewed in FIG. 12A), and then impregnating the layered body 300F in the etching solution.

That is to say, the side surfaces of the Si substrate 10B, the buffer layer 11B, the contact layer 12B, the GaInP cell 20, the tunnel junction layer 13, the GaAs cell 30, the tunnel junction layer 313B, the bonding layer 314B, the bonding layer 314A, the GaInPAs cell 350, the tunnel junction layer 313A, the GaInAs cell 340, the contact layer 312A, the metal layer 315A, the bonding layer 316, the metal layer 15B, and the support substrate 80, and the surface of the support substrate 80 (bottom surface as viewed in FIG. 12A) are to be protected by a protective layer, and then the layered body 300F is to be impregnated in the etching solution. A protective layer will not be used when there is no need for protection in the above etching process.

Furthermore, in this case, a description is given of an embodiment in which both the Si substrate 10B and the buffer layer 11B are removed by etching. However, by removing the buffer layer 11B with the use of a solution for selectively etching only the buffer layer 11B, the Si substrate 10B may be removed from the layered body 300F. As such an etching solution, for example, a nitrohydrofluoric acid solution (a mixed solution of hydrofluoric acid and nitric acid) may be used. Note that water may be added to the nitrohydrofluoric acid solution to dilute the solution.

Figure 13:
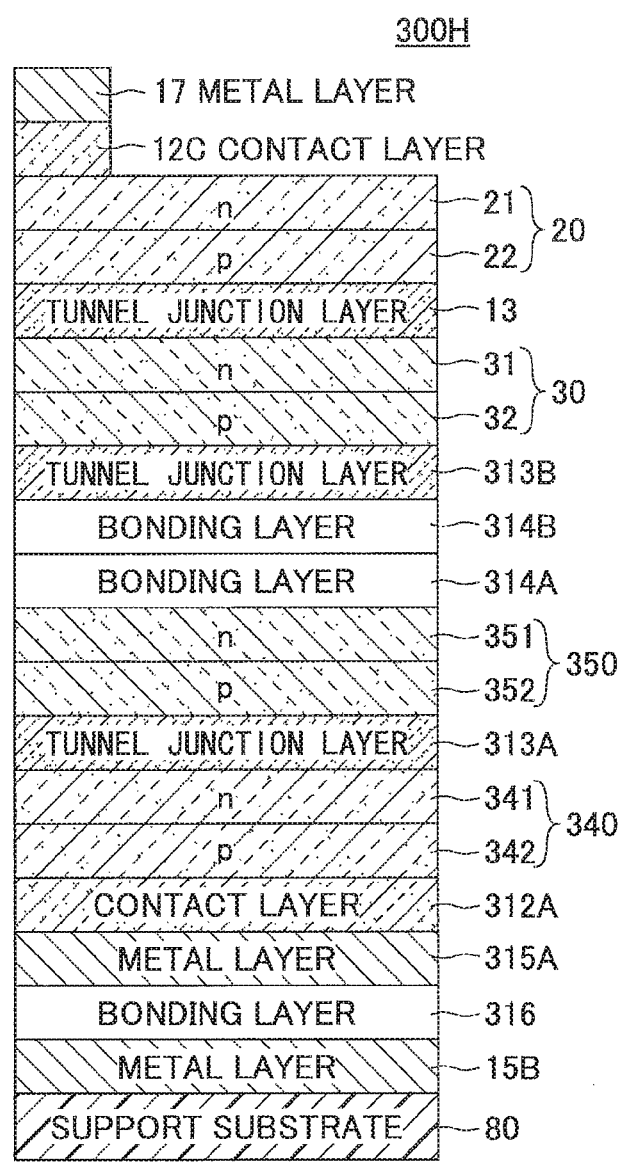
FIG. 13 illustrates the photovoltaic cell manufacturing method according to the third embodiment.

Lastly, as illustrated in FIG. 13, a metal layer 17 is formed on the top surface of the contact layer 12B of the layered body 300G (see FIG. 12B). The metal layer 17 is formed on part of the top surface of the contact layer 12B (see FIG. 12B). This is because the metal layer 17 becomes the top electrode of the photovoltaic cell.

The metal layer 17 may be formed by, for example, a lift off method. The metal layer 17 is formed by forming a resist on the top surface of the contact layer 12B illustrated in FIG. 12B, in areas other than the area where the metal layer 17 illustrated in FIG. 13 is to be formed, vapor-depositing metal such as Au or Ag above the resist, and then removing the resist.

Note that a contact layer 12C illustrated in FIG. 3 is formed by forming the metal layer 17 (see FIG. 13) on the top surface of the contact layer 12B illustrated in FIG. 12B, and then using this metal layer 17 as a mask in removing parts of the contact layer 12B (see FIG. 12B) other than the part positioned immediately below the metal layer 17.

The contact layer 12C may be made by, for example, using a mixed liquid including sulfuric acid ($H_2SO_4$), hydrogen peroxide ($H_2O_2$), and water ($H_2O$), as the wet etching solution.

According to the above, a layered body 300H illustrated in FIG. 13 can be made. The layered body 300H is a photovoltaic cell including four photoelectric conversion cells from the light incident direction, i.e., the GaInP cell 20 (1.9 eV), the GaAs cell 30 (1.4 eV), the GaInPAs cell 350 (1.0 eV), and the GaInAs cell 340 (0.7 eV). That is to say, the layered body 300H is a photovoltaic cell made of a compound semiconductor.

A document (Proceedings of the 28th IEEE Photovoltaic Specialists Conference (2009) pp. 1090-1093.) describes that in a quadruple-junction photovoltaic cell, the balance of band gaps of approximately 1.9 eV/1.4 eV/1.0 eV/0.7 eV is preferable.

Furthermore, a document (Applied physics, volume 79, no. 5, 2010, P. 436) describes that a combination of 1.9 eV/1.4 eV/1.0 eV and a combination of 1.7 eV/1.2 eV/0.67 eV are more preferable than the present triple-junction cell (1.9 eV/1.4 eV/0.67 eV) described in the document.

Incidentally, it is difficult to realize a combination of band gaps as described above, with a single substrate. This is because the above quadruple-junction photovoltaic cell and the triple-junction photovoltaic cell include photoelectric conversion cells having different lattice constants.

Meanwhile, by the photovoltaic cell manufacturing method according to the third embodiment, photoelectric conversion cells having different lattice constants (340 and 350; and 20 and 30) are formed on separate Si substrates 10A and 10B. Furthermore, the photoelectric conversion cells having different lattice constants (340 and 350; and 20 and 30) formed on separate Si substrates 10A and 10B, are bonded together by a direct bonding method, to manufacture a photovoltaic cell.

Thus, according to the third embodiment, a photovoltaic cell including photoelectric conversion cells of different lattice constants, can be easily manufactured.

Note that in the third embodiment, a description is given of an embodiment of manufacturing a photovoltaic cell (layered body 300H) including a combination of band gaps of 1.9 eV/1.4 eV/1.0 eV/0.7 eV.

However, the combination of band gaps is not so limited. By changing the composition of materials in each photoelectric conversion cell, the balance of the band gap can be changed. Therefore, by changing the composition of materials in each photoelectric conversion cell, the balance of the band gaps can be optimized.

For example, a document (Progress in Photovoltaics 10, 2002, pp. 323-329) describes that in a quadruple-junction photovoltaic cell, the combination of 2.1 eV/1.5 eV/1.1 eV/0.8 eV is preferable.

In the photovoltaic cell (layered body 300H) according to the third embodiment, an AlGaInP cell is formed by adding Al to the GaInP cell 20, so that the band gap can be adjusted to 2.1 eV.

Furthermore, a GaInPAs cell is formed by adding In and P to the GaAs cell 30, so that the band gap can be adjusted to 1.5 eV.

Furthermore, by adjusting the composition of the GaInPAs cell 350, the band gap can be adjusted to 1.1 eV.

Furthermore, a GaInPAs cell is formed by adding P to the GaInAs cell 340, so that the band gap can be adjusted to 0.8 eV.

The energy conversion efficiency of the quadruple-junction photovoltaic cell (layered body 300H) having a combination of 1.9 eV/1.4 eV/1.0 eV/0.7 eV, according to an embodiment, is higher than that of a triple-junction photovoltaic cell having a combination of 1.9 eV/1.4 eV/0.67 eV.

Thus, according to the third embodiment, a high-efficiency compound semiconductor photovoltaic cell can be produced at a low cost, without using a compound semiconductor substrate.

Furthermore, in the third embodiment, a description is given of a case of joining together a GaAs lattice matching material with an InP lattice matching material; however, a Ge lattice matching material may be used instead of a GaAs lattice matching material. In this case, the lattice constant of the Ge lattice matching material is slightly higher than the lattice constant of the GaAs lattice matching material; and therefore the composition of the Ge lattice matching material is to be appropriately adjusted. Note that instead of the GaAs cell 30, a cell made of GaInAs having an In composition of approximately 1% may be used. The outermost surface of the buffer layer 11 is Ge, which can be made more easily.

Furthermore, the buffer layers 11B, 311A, which are for realizing lattice relaxation for eliminating an inconsistency in the lattice constant of the Si substrate 10 and the photoelectric conversion cells made of compound semiconductor (20, 30, 340, 350), include many defects (lattice defects). Therefore, if the buffer layers 11B, 311A are included in the final product, a recombination center may be formed, which may deteriorate the efficiency.

However, the buffer layers 11B, 311A are removed in a mid-procedure of the photovoltaic cell manufacturing method according to the third embodiment, and are not included in the final product (layered body 300H).

Therefore, by the photovoltaic cell manufacturing method according to the third embodiment, a photovoltaic cell (layered body 300H) having high reliability can be manufactured.

In the photovoltaic cell manufactured by the manufacturing method according to the third embodiment, the buffer layers 11B, 311A for relaxing the difference in the lattice constant do not remain in the final product of the photovoltaic cell, and therefore it is possible to manufacture a photovoltaic cell having higher reliability than the photovoltaic cell described in Non-patent Document 1.

Furthermore, according to the third embodiment, the Si substrates 10A, 10B are removed, and photoelectric conversion cells (20, 30, 340, 350) made of a compound semiconductor are bonded together with the support substrate 80 made of a plastic film, and therefore a flexible and lightweight photovoltaic cell can be manufactured.

In the above description, the GaInAs cell 340 and the GaInPAs cell 350 are formed as examples of cells formed with an InP lattice matching material. That is to say, the InP lattice matching material can be expressed as GaIn(P)As.

Furthermore, in the above description, the GaInP cell 20 and the GaAs cell 30 are formed as examples of cells formed with a GaAs matching material. Instead of the GaInP cell 20, a cell formed of a material expressed by (Al)GaInP(As) may be used.

Note that an anti-reflection film may be formed at the light incident surface (the part not covered by the contact layer 312A or the metal layer 17) on the top surface of the GaInP cell 20 of the photovoltaic cell (layered body 100D) illustrated in FIG. 13.

Furthermore, similar to the modification (see FIG. 8) of the second embodiment, the bonding layer 314A and the bonding layer 314B may be connected by a fixing member. In this case, the tunnel junction layer 313B is unnecessary.

Fourth Embodiment

A photovoltaic cell manufacturing method according to a fourth embodiment is for manufacturing a triple-junction photovoltaic cell including three photoelectric conversion cells of an AlInAs cell (1.9 eV)/a GaInPAs cell (1.3 eV)/a GaInAs cell (0.9 eV).

FIGS. 14A through 16 illustrate a photovoltaic cell manufacturing method according to a fourth embodiment.

Figure 14A:
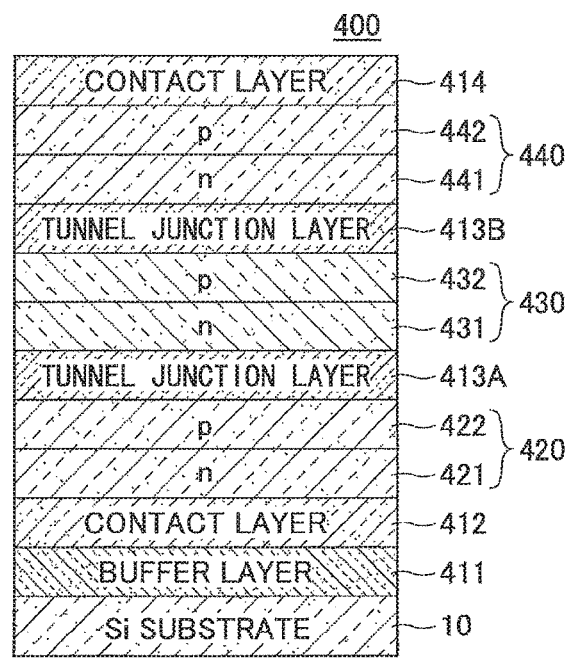
FIGS. 14A and 14B illustrate a photovoltaic cell manufacturing method according to a fourth embodiment.

First, as illustrated in FIG. 14A, a buffer layer 411, a contact layer 412, an AlInAs cell 420, a tunnel junction layer 413A, a GaInPAs cell 430, a tunnel junction layer 413B, a GaInAs cell 440, and a contact layer 414 are sequentially deposited on the Si substrate 10.

A layered body 400 illustrated in FIG. 14A is made assuming that sunlight enters from the bottom side as viewed in FIG. 14A.

The Si substrate 10 is the same as the Si substrate 10 of the first embodiment.

The buffer layer 411 is formed by directly depositing a Ge layer on the Si substrate 10 by a CVD method, and causing a defect in the Ge layer by performing a thermal cycling process (TCA) so that a structure for relaxing the difference in the lattice constant of Si and Ge is formed in the Ge layer. Subsequently, a flattening process is performed on the surface of the Ge layer.

Then, on the Ge layer on which the flattening layer has been performed, a GaAs layer is formed by a MOCVD method. Furthermore, on the GaAs layer, a composition sloped layer made of AlInAs is formed by a MOCVD method, so that further lattice relaxation is realized.

Specifically, as the composition sloped layer made of AlInAs, the composition ratio of In in the layer is gradually increased (in a sloped manner), from AlAs (lattice constant: approximately 5.65 Å) having a lattice constant that is substantially equal to that of GaAs, to AlInAs having a lattice constant that slightly exceeds 5.8 Å. Then, the composition ratio of In is slightly reduced just before the topmost layer of the AlInAs composition sloped layer, so that the lattice constant of the AlInAs composition sloped layer is reduced to 5.8 Å. Then, as the topmost layer of the composition sloped layer made of AlInAs, a layer having a fixed composition ratio of In is formed, by which a lattice constant of 5.8 Å can be obtained.

That is to say, as the buffer layer 411, a layer including a Ge layer, a GaAs layer, and a composition sloped layer made of AlInAs, is formed on the Si substrate 10.

Furthermore, the contact layer 412 is mainly a layer to be deposited on the buffer layer 411 for ohmic-connecting with a metal layer 17 (see FIG. 16) to be formed later. The contact layer 412 is formed by depositing a GaInAs layer on the buffer layer 411 by a MOCVD method.

The AlInAs cell 420 is a photoelectric conversion cell made of a compound semiconductor, including aluminum (Al), indium (In), and arsenic (As) as raw materials. The AlInAs cell 420 includes an n-layer 421 and a p-layer 422. For example, the AlInAs cell 420 is formed by a MOCVD method, by sequentially depositing the n-layer 421 and the p-layer 422 on the contact layer 412.

As the dopant of the n-layer 421, for example, silicon (Si) or selenium (Se) may be used. Furthermore, as the dopant of the p-layer 422, for example, zinc (Zn) or magnesium (Mg) may be used. In the fourth example, the composition of Al, In, and As is adjusted so that the band gap of the AlInAs cell 420 becomes 1.9 eV.

The lattice constant of the AlInAs cell 420 is adjusted to approximately 5.8 Å, and the AlInAs cell 420 can crystal-grow on the buffer layer 411.

Note that between the n-layer 421 and the contact layer 412 of the AlInAs cell 420 (incident side to the AlInAs cell 420), a window layer having a wider gap than that of the AlInAs cell 420 may be formed. Furthermore, above the p-layer 422 (between the p-layer 422 and the tunnel junction layer 413A), a BSF (Back Surface Field) layer having a wider gap than that of the AlInAs cell 420 may be formed.

The tunnel junction layer 413A is provided between the AlInAs cell 420 and the GaInPAs cell 430, and includes a p-layer and an n-layer of AlInAs that have been doped at a higher density than that of the n-layer 421 and the p-layer 422 of the AlInAs cell 420 and an n-layer 431 and a p-layer 432 of the GaInPAs cell 430. The tunnel junction layer 413A is a junction layer, which is provided so that a current flows between the p-layer 422 of the AlInAs cell 420 and the n-layer 431 of the GaInPAs cell 430 (by tunnel junction).

For example, the tunnel junction layer 413A is formed by a MOCVD method, by sequentially depositing a p type AlInAs layer and an n type AlInAs layer in the stated order on the surface of the AlInAs cell 420. The p-layer and the n-layer of the tunnel junction layer 413A are preferably formed with a material having a wider band gap than that of the AlInAs cell 420. This is to prevent the light that has been transmitted through the AlInAs cell 420 from being absorbed at the tunnel junction layer 413A.

Note that the composition of the tunnel junction layer 413A is adjusted so that its lattice constant becomes approximately 5.8 Å, and the tunnel junction layer 413A can crystal-grow on the AlInAs cell 420.

The GaInPAs cell 430 is a photoelectric conversion cell made of a compound semiconductor, including gallium (Ga), indium (In), phosphorus (P), and arsenic (As) as raw materials. The GaInPAs cell 430 includes the n-layer 431 and the p-layer 432. For example, the GaInPAs cell 430 is formed by a MOCVD method, by sequentially depositing the n-layer 431 and the p-layer 432 on the tunnel junction layer 413A.

As the dopant of the n-layer 431, for example, silicon (Si) or selenium (Se) may be used. Furthermore, as the dopant of the p-layer 432, for example, zinc (Zn) or magnesium (Mg) may be used. In the fourth embodiment, the composition of Ga, In, P, and As is adjusted so that the band gap of the GaInPAs cell 430 becomes 1.3 eV.

The composition of the GaInPAs cell 430 is adjusted so that the lattice constant becomes approximately 5.8 Å, and the GaInPAs cell 430 can crystal-grow on the tunnel junction layer 413A.

Furthermore, between the n-layer 431 of the GaInPAs cell 430 and the tunnel junction layer 413A (incident side to the GaInPAs cell 430), a window layer having a wider gap than that of the GaInPAs cell 430 may be formed. Furthermore, above the p-layer 432 (between the p-layer 432 and the tunnel junction layer 413B), a BSF (Back Surface Field) layer having a wider gap than that of the GaInPAs cell 430 may be formed.

The tunnel junction layer 413B is provided between the GaInPAs cell 430 and the GaInAs cell 440, and includes an n-layer and a p-layer that have been doped at a higher density than that of the n-layer 431 and the p-layer 432 of the GaInPAs cell 430 and an n-layer 441 and a p-layer 442 of the GaInAs cell 440. The tunnel junction layer 413B is a junction layer, which is provided so that a current flows between the p-layer 432 of the GaInPAs cell 430 and the n-layer 441 of the GaInAs cell 440 (by tunnel junction).

For example, the tunnel junction layer 413B is formed by a MOCVD method, by depositing a p type AlGaInAs layer and an n type AlGaInAs layer in the stated order on the surface of the GaInPAs cell 430. The p-layer and the n-layer of the tunnel junction layer 413B are preferably formed with a material having a wider band gap than that of the GaInPAs cell 430. This is to prevent the light that has been transmitted through the GaInPAs cell 430 from being absorbed at the tunnel junction layer 413B.

Note that the composition of the tunnel junction layer 413B is adjusted so that its lattice constant becomes approximately 5.8 Å, and the tunnel junction layer 413B can crystal-grow on the GaInPAs cell 430.

The GaInAs cell 440 is a photoelectric conversion cell made of a compound semiconductor, including gallium (Ga), indium (In), and arsenic (As) as raw materials. The GaInAs cell 440 includes the n-layer 441 and the p-layer 442. For example, the GaInAs cell 440 is formed by a MOCVD method, by sequentially depositing the n-layer 441 and the p-layer 442 on the tunnel junction layer 413B.

As the dopant of the n-layer 441, for example, silicon (Si) or selenium (Se) may be used. Furthermore, as the dopant of the p-layer 442, for example, zinc (Zn) or magnesium (Mg) may be used. In the fourth example, the composition of Ga, In, and As is adjusted so that the band gap of the GaInAs cell 440 becomes 0.9 eV.

The composition of the GaInAs cell 440 is adjusted so that the lattice constant becomes approximately 5.8 Å, and the GaInAs cell 440 can crystal-grow on the tunnel junction layer 413B.

Furthermore, between the n-layer 441 of the GaInAs cell 440 and the tunnel junction layer 413B (incident side to the GaInAs cell 440), a window layer having a wider gap than that of the GaInAs cell 440 may be formed. Furthermore, above the p-layer 442 (between the p-layer 442 and the contact layer 414), a BSF (Back Surface Field) layer having a wider gap than that of the GaInAs cell 440 may be formed.

The contact layer 414 is mainly a layer to be deposited on the GaInAs cell 440 for ohmic-connecting with an electrode (metal layer 415A) to be formed later. For example, a gallium indium arsenide (GaInAs) layer is used as the contact layer 414. For example, the GaInAs layer acting as the contact layer 414 may be formed on the GaInAs cell 440 by a MOCVD method.

Note that the composition of the contact layer 414 is adjusted so that its lattice constant becomes approximately 5.8 Å, and the contact layer 414 can crystal-grow on the tunnel junction layer 413B.

As described above, the layered body 400 illustrated in FIG. 14A is formed by sequentially depositing, on the Si substrate 10 and the buffer layer 411, the contact layer 412 that is the light incident side, the AlInAs cell 420, the GaInPAs cell 430, the GaInAs cell 440, and the contact layer 414, in the stated order.

Accordingly, the AlInAs cell 420 (1.9 eV) having the widest band gap is provided closer to the light incident side, than the GaInPAs cell 430 (1.3 eV) and the GaInAs cell 440 (0.9 eV).

Furthermore, the GaInPAs cell 430 (1.3 eV) is provided closer to the light incident side, than the GaInAs cell 440 (0.9 eV).

Figure 14B:
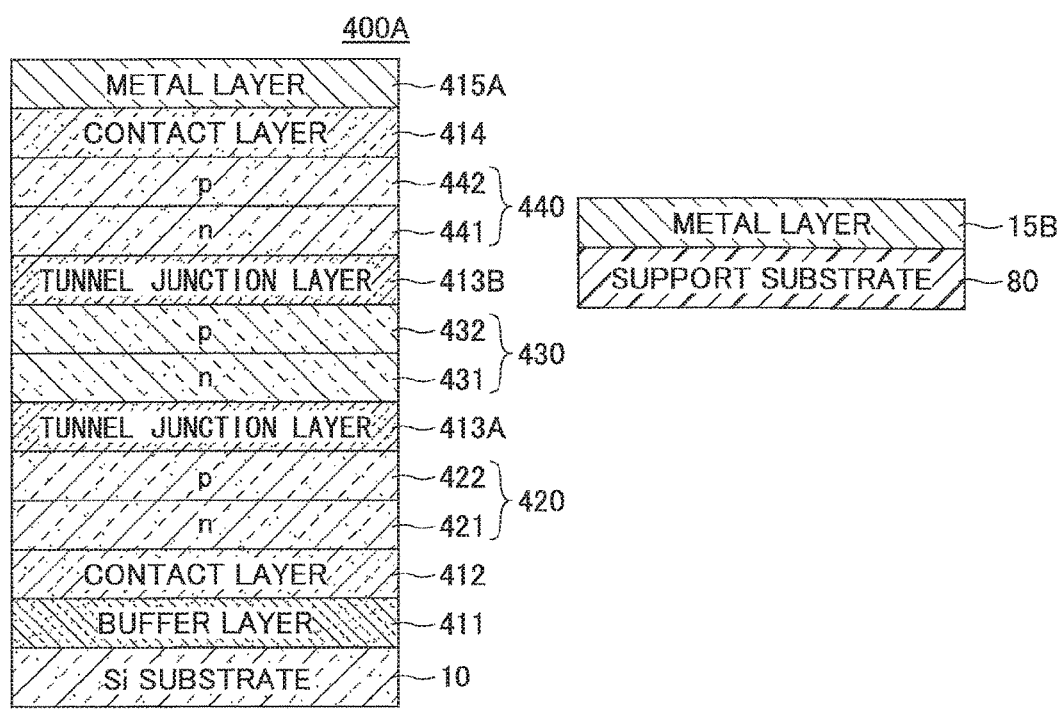

Next, as illustrated in FIG. 14B, a support substrate 80 is prepared, and a metal layer 415A is formed on the contact layer 414, and a metal layer 15B is formed on the support substrate 80. The metal layers 415A, 15B are thin films made of a metal such as gold (Au) or silver (Ag), and may be formed by a vapor deposition method or a sputtering method. Furthermore, the support substrate 80 may be, for example, a film made of plastic.

Note that the object formed by forming the metal layer 415A on the contact layer 414 of the layered body 400 illustrated in FIG. 8A is referred to as a layered body 400A.

Figure 15A:
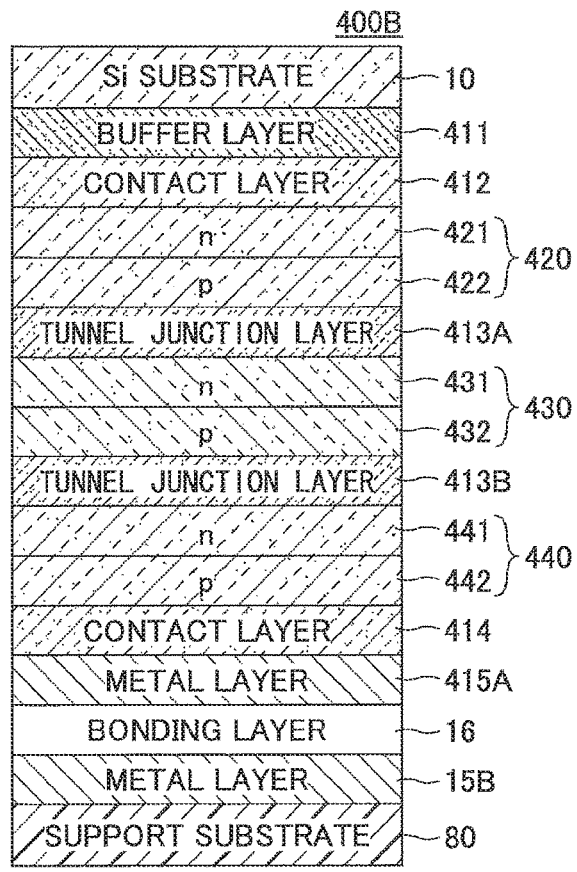
FIGS. 15A and 15B illustrate the photovoltaic cell manufacturing method according to the fourth embodiment.

Next, as illustrated in FIG. 15A, the layered body 400A is turned upside down, and a bonding layer 16 is used to join the metal layer 415A of the layered body 400A with the metal layer 15B formed on the surface of the support substrate 80.

The bonding layer 16 is formed by, for example, applying, on the surface of the metal layer 415A or the metal layer 15B, a joining material such as a conductive epoxy agent formed, for example, by including silver (Ag) nanoparticles in epoxy resin. The bonding layer 16 is formed by, for example, applying the joining material on the metal layer 415A or the metal layer 15B by screen printing.

A layered body 400B as illustrated in FIG. 15A is formed by joining together the metal layer 415A and the metal layer 15B by using the bonding layer 16 as described above. In this case, the bonding layer 16 is heated so that the metal layer 415A and the metal layer 15B are fused together by the bonding layer 16. The layered body 400B includes the layered body 400A, the bonding layer 16, the metal layer 15B, and the support substrate 80.

Note that the metal layer 415A, the bonding layer 16, and the metal layer 15B are used as the bottom electrode (backside electrode) of the photovoltaic cell.

Figure 15B:
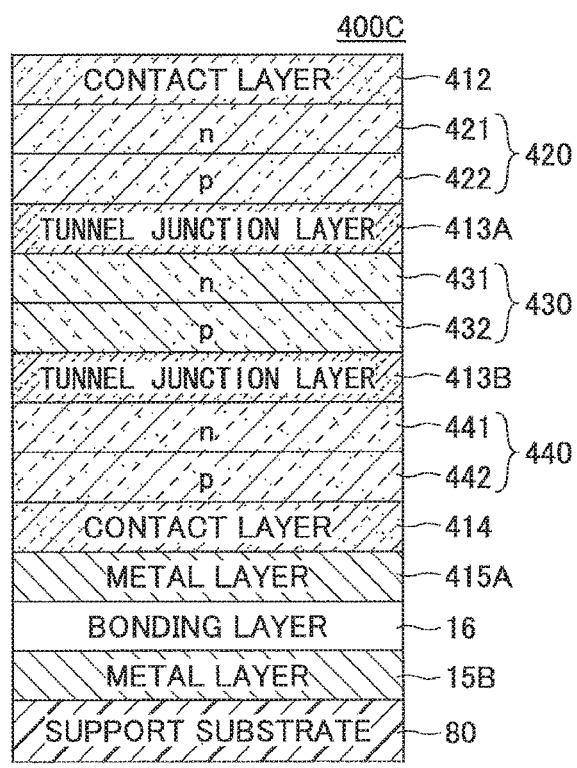

Next, the Si substrate 10 and the buffer layer 411 are removed from the layered body 400B by etching the Si substrate 10 and the buffer layer 411 of the layered body 400B illustrated in FIG. 15A. Accordingly, a layered body 400C as illustrated in FIG. 15B is formed. The layered body 400C is formed by removing the Si substrate 10 and the buffer layer 411 from the layered body 400B illustrated in FIG. 15A.

The etching of the Si substrate 10 and the buffer layer 411 is performed by, for example, etching the Ge layers in the Si substrate 10 and the buffer layer 411, with a mixed solution ($HF:HNO_3:CH_3COOH$ mixed solution) including hydrofluoric acid (HF), nitric acid ($HNO_3$), and acetic acid ($CH_3COOH$). Furthermore, the GaAs layer and the AlInAs composition sloped layer in the buffer layer 411 are to be etched with a mixed solution ($H_2SO_4:H_2O_2:H_2O$ mixed solution) including sulfuric acid ($H_2SO_4$), hydrogen peroxide ($H_2O_2$), and water ($H_2O$).

In this case, the mixed solution including sulfuric acid ($H_2SO_4$), hydrogen peroxide ($H_2O_2$), and water ($H_2O$) dissolves the GaInAs in the contact layer 412, and therefore by providing an etching stop-layer such as a GaInP-layer between the buffer layer 411 and the contact layer 412A, the wet etching process can be stopped.

Note that the etching is to be performed by protecting, with a protective layer, the portions other than the top surface of the Si substrate 10 of the layered body 400B (top surface as viewed in FIG. 15A), and then impregnating the layered body 400B in the etching solution.

That is to say, the side surfaces of the Si substrate 10, the buffer layer 411, the contact layer 412, the AlInAs cell 420, the tunnel junction layer 413A, the GaInPAs cell 430, the tunnel junction layer 413B, the GaInAs cell 440, the contact layer 414, the metal layer 415A, the bonding layer 16, the metal layer 15B, and the support substrate 80 and the surface of the support substrate 80 (bottom surface as viewed in FIG. 15A) are to be protected by a protective layer, and then the layered body 400B is to be impregnated in the etching solution. A protective layer will not be used when there is no need for protection in the above etching process.

Furthermore, in this case, a description is given of an embodiment in which both the Si substrate 10 and the buffer layer 411 are removed by etching. However, by removing the buffer layer 411 with the use of a solution for selectively etching only the buffer layer 411, the Si substrate 10 may be removed from the layered body 400B. As such an etching solution, for example, a nitrohydrofluoric acid solution (a mixed solution of hydrofluoric acid and nitric acid) may be used. Note that water may be added to the nitrohydrofluoric acid solution to dilute the solution.

Lastly, a metal layer 17 is formed on the top surface of the contact layer 412 of the layered body 400C illustrated in FIG. 15B. The metal layer 17 is formed on part of the top surface of the contact layer 412. This is because the metal layer 17 becomes the top electrode of the photovoltaic cell.

The metal layer 17 may be formed by, for example, a lift off method. The metal layer 17 is formed by forming a resist on the top surface of the contact layer 412 illustrated in FIG. 15B, in areas other than the area where the metal layer 17 illustrated in FIG. 16 is to be formed, vapor-depositing metal such as Au or Ag from above the resist, and then removing the resist.

Figure 16:
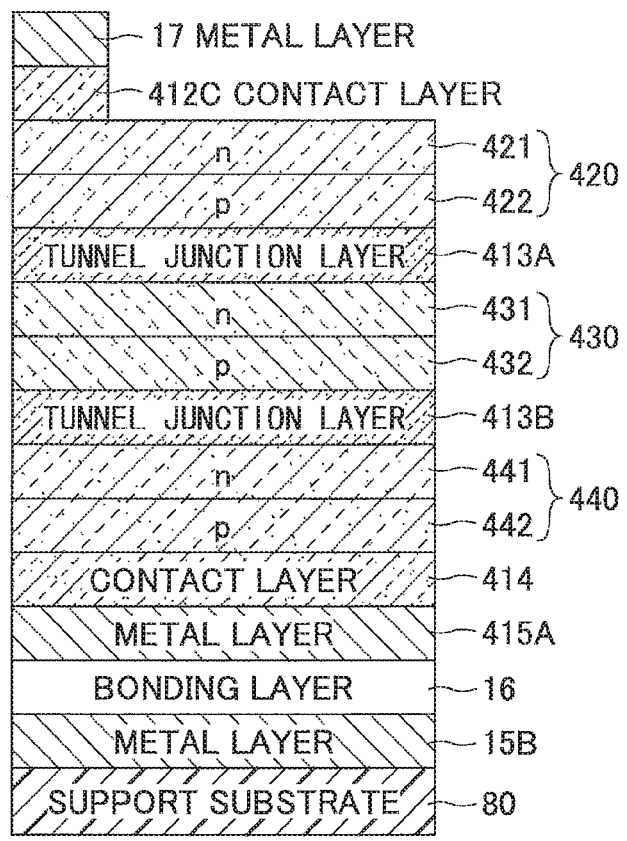
FIG. 16 illustrates the photovoltaic cell manufacturing method according to the fourth embodiment.

Note that a contact layer 412C illustrated in FIG. 16 is formed by forming the metal layer 17 (see FIG. 16) on the top surface of the contact layer 412 illustrated in FIG. 15B, and then using this metal layer 17 as a mask in removing parts of the contact layer 412 (see FIG. 15B) other than the part positioned immediately below the metal layer 17.

The contact layer 412C may be made by, for example, using a mixed liquid including sulfuric acid ($H_2SO_4$), hydrogen peroxide ($H_2O_2$), and water ($H_2O$), as the wet etching solution. In order to stop the wet etching solution formed by the mixed liquid including sulfuric acid ($H_2SO_4$), hydrogen peroxide ($H_2O_2$), and water ($H_2O$), a GaInP-layer may be provided between the AlInAs cell 420 and the contact layer 412C.

According to the above, a layered body 400D illustrated in FIG. 16 can be made. The layered body 400D is a photovoltaic cell including three photoelectric conversion cells, i.e., the AlInAs cell 420 (1.9 eV), the GaInPAs cell 430 (1.3 eV), and the GaInAs cell 440 (0.9 eV). That is to say, the layered body 400D is a photovoltaic cell made of a compound semiconductor.

In the layered body 400D, the buffer layer 411 is an example of a first buffer layer, and the AlInAs cell 420, the GaInPAs cell 430, and the GaInAs cell 440 are examples of a first photoelectric conversion cell. Furthermore, the layered body 400B illustrated in FIG. 15A is an example of a first layered body, and the Si substrate 10 is an example of a first silicon substrate.

According to the photovoltaic cell manufacturing method according to the fourth embodiment described above, the layered body 400B (see FIG. 15A) is made by forming the buffer layer 111 on the Si substrate 10, and forming the AlInAs cell 420, the tunnel junction layer 413A, the GaInPAs cell 430, the tunnel junction layer 413B, the GaInAs cell 440, and the contact layer 414, on the buffer layer 411.

Then, after removing the Si substrate 10 and the buffer layer 411 from the layered body 400B, the metal layer 17 is formed on the contact layer 412, and the contact layer 412C is formed from the contact layer 412.

That is to say, by the photovoltaic cell manufacturing method according to the fourth embodiment, the buffer layer 411 for relaxing the difference in the lattice constant between silicon and the compound semiconductor layer, is formed on the inexpensive Si substrate 10, so that the AlInAs cell 420, the tunnel junction layer 413A, the GaInPAs cell 430, the tunnel junction layer 413B, the GaInAs cell 440, and the contact layer 14 can be formed on the Si substrate 10.

Then, in the manufacturing process, the Si substrate 10 and the buffer layer 411 are removed from the layered body 400B (see FIG. 15A), by wet etching the Si substrate 10 and the buffer layer 411.

Accordingly, a photovoltaic cell (layered body 400D) made of a compound semiconductor can be manufactured at a low cost.

A document (Progress in Photovoltaics 10, 2002, pp. 323-329) describes that in a triple-junction photovoltaic cell, the combination of 1.9 eV/1.3 eV/0.9 eV is preferable.

However, the photoelectric conversion cell made of a compound semiconductor included in such a triple-junction photovoltaic cell has a lattice constant that is different from that of silicon. Therefore, it is difficult to form the photoelectric conversion cell on a silicon substrate.

Meanwhile, by the photovoltaic cell manufacturing method according to the fourth embodiment, on the Si substrate 10, there is provided the buffer layer 11 for cancelling out the difference in the lattice constant of Si and the compound semiconductor, and three photoelectric conversion cells (420, 430, 440) are caused to crystal-grow on the buffer layer 11.

Thus, according to the fourth embodiment, there is no need to form a photoelectric conversion cell made of a compound semiconductor on a substrate having the same lattice constant as that of a compound semiconductor such as a GaAs substrate and an InP substrate.

In the fourth embodiment, a predetermined lattice constant that matches that of the compound semiconductor is realized by the buffer layer 11 formed on the Si substrate 10. Then, three photoelectric conversion cells (420, 430, 440) are caused to crystal-grow on the buffer layer 11. Therefore, a photovoltaic cell including a photoelectric conversion cell made of a compound semiconductor can be manufactured at a low cost, without using an expensive substrate such as a GaAs substrate and an InP substrate.

A structure in which the buffer layer 11 having a predetermined lattice constant that matches that of the compound semiconductor is formed on the Si substrate 10, may act as a pseudo-substrate of an expensive substrate such as a GaAs substrate and an InP substrate.

The energy conversion efficiency of a triple-junction photovoltaic cell having a combination of band gaps of 1.9 eV/1.3 eV/0.9 eV according to the fourth embodiment, is higher than that of a standard triple-junction photovoltaic cell having a combination of band gaps of 1.9 eV/1.4 eV/0.66 eV.

Thus, according to the fourth embodiment, a low-cost, high-efficiency photovoltaic cell made of a compound semiconductor can be produced, without using a compound semiconductor substrate such as a GaAs substrate and an InP substrate.

Furthermore, the buffer layer 11 which is for realizing lattice relaxation for eliminating an inconsistency in the lattice constant of the Si substrate 10 and the photoelectric conversion cells made of a compound semiconductor (420, 430, 440), includes many defects (lattice defects). Therefore, if the buffer layer 11 is included in the final product, a recombination center may be formed, which may deteriorate the efficiency.

However, the buffer layer 11 is removed in a mid-procedure of the photovoltaic cell manufacturing method according to the fourth embodiment, and is not included in the final product (layered body 400D).

Therefore, by the photovoltaic cell manufacturing method according to the fourth embodiment, a photovoltaic cell (layered body 400D) having high reliability can be manufactured.

In the photovoltaic cell manufactured by the manufacturing method according to the fourth embodiment, the buffer layer 11 for relaxing the difference in the lattice constant does not remain in the final product of the photovoltaic cell, and therefore it is possible to manufacture a photovoltaic cell having higher reliability than the photovoltaic cell described in Non-patent Document 1.

Furthermore, according to the fourth embodiment, the Si substrate 10 is removed, and photoelectric conversion cells (420, 430, 440) made of a compound semiconductor are bonded together with the support substrate 80 made of a plastic film, and therefore a flexible and light-weight photovoltaic cell can be manufactured.

Furthermore, an anti-reflection film may be formed at the light incident surface (the part not covered by the contact layer 412C or the metal layer 17) on the top surface of the AlInAs cell 420 of the photovoltaic cell (layered body 400D) illustrated in FIG. 16.

According to an embodiment of the present invention, a photovoltaic cell manufacturing method is provided, by which a photovoltaic cell made of a compound semiconductor can be manufactured at a low cost The photovoltaic cell manufacturing method is not limited to the specific embodiments described herein, and variations and modifications may be made without departing from the scope of the present invention.

The present application is based on and claims the benefit of priority of Japanese Priority Patent Application No. 2012-257829, filed on Nov. 26, 2012 and Japanese Priority Patent Application No. 2013-187295, filed on Sep. 10, 2013, the entire contents of which are hereby incorporated herein by reference.

The invention claimed is:

1. A photovoltaic cell manufacturing method comprising:
    depositing a first buffer layer on a first silicon substrate, for performing lattice relaxation;
    depositing a first photoelectric conversion cell on the first buffer layer,
    the first photoelectric conversion cell being formed by a compound semiconductor that includes a pn junction, and the first photoelectric conversion cell having a lattice constant that is higher than a lattice constant of the first silicon substrate, wherein
    the lattice relaxation by the first buffer layer disposed between the first silicon substrate and the first photoelectric conversion cell relaxes a difference between the lattice constant of the first silicon substrate and the lattice constant of the first photoelectric conversion cell;
    forming a second photoelectric conversion cell on a second silicon substrate;
    forming a layered body including the first silicon substrate, the first buffer layer, the first photoelectric conversion cell deposited on the first buffer layer and having the lattice constant that is higher than that of the first silicon substrate on which the first buffer layer was deposited, the second photoelectric conversion cell, and the second silicon substrate, by bonding the first photoelectric conversion cell and the second photoelectric conversion cell; and
    removing the first silicon substrate and the first buffer layer from the first photoelectric conversion cell.

2. The photovoltaic cell manufacturing method according to claim 1, wherein the first photoelectric conversion cell and the second photoelectric conversion cell are stacked in series with each other in a stack direction.

3. The photovoltaic cell manufacturing method according to claim 1, wherein the first photoelectric conversion cell is formed with a material having a lattice constant that is between a lattice constant of GaAs and a lattice constant of InP.

4. The photovoltaic cell manufacturing method according to claim 1, wherein a part of the first buffer layer is a Ge layer or a SiGe layer.

5. The photovoltaic cell manufacturing method according to claim 1, wherein the first buffer layer is a strained super lattice layer including GaAs.

6. The photovoltaic cell manufacturing method according to claim 1, further comprising:
  depositing a first joining layer on the first photoelectric conversion cell after forming the first photoelectric conversion cell; and
  depositing a second joining layer on the second photoelectric conversion cell,
  wherein the forming of the layered body includes joining the first photoelectric conversion cell and the second photoelectric conversion cell, by joining the first joining layer and the second joining layer.

7. The photovoltaic cell manufacturing method according to claim 1, wherein at least a part of the first buffer layer has a lattice constant that is higher than the lattice constant of the first silicon substrate and lower than the lattice constant of the first photoelectric conversion cell.

8. A photovoltaic cell manufacturing method comprising:
  depositing a first buffer layer on a first silicon substrate, for performing lattice relaxation;
  depositing a first photoelectric conversion cell on the first buffer layer, the first photoelectric conversion cell being formed by a compound semiconductor that includes a pn junction, and the first photoelectric conversion cell having a lattice constant that is higher than a lattice constant of the first silicon substrate, wherein the lattice relaxation by the first buffer layer disposed between the first silicon substrate and the first photoelectric conversion cell relaxes a difference between the lattice constant of the first silicon substrate and the lattice constant of the first photoelectric conversion cell;
  forming a second photoelectric conversion cell on a second silicon substrate;
  forming a layered body including the first silicon substrate, the first buffer layer, the first photoelectric conversion cell deposited on the first buffer layer and having the lattice constant that is higher than that of the first silicon substrate on which the first buffer layer was deposited, the second photoelectric conversion cell, and the second silicon substrate, by bonding the first photoelectric conversion cell and the second photoelectric conversion cell; and
  removing the first silicon substrate and the first buffer layer from the first photoelectric conversion cell,
  wherein the second photoelectric conversion cell is made of a silicon semiconductor.

9. The photovoltaic cell manufacturing method according to claim 8, wherein the first photoelectric conversion cell is formed with a material having band gap energy of 1.4 eV through 1.9 eV.

10. The photovoltaic cell manufacturing method according to claim 8, wherein the first photoelectric conversion cell and the second photoelectric conversion cell are stacked in series with each other in a stack direction.

11. The photovoltaic cell manufacturing method according to claim 8, wherein the first photoelectric conversion cell is formed with a material having a lattice constant that is between a lattice constant of GaAs and a lattice constant of InP.

12. The photovoltaic cell manufacturing method according to claim 8, wherein a part of the first buffer layer is a Ge layer or a SiGe layer.

13. The photovoltaic cell manufacturing method according to claim 8, wherein the first buffer layer is a strained super lattice layer including GaAs.

14. The photovoltaic cell manufacturing method according to claim 8, further comprising:
  depositing a first joining layer on the first photoelectric conversion cell after forming the first photoelectric conversion cell; and
  depositing a second joining layer on the second photoelectric conversion cell,
  wherein the forming of the layered body includes joining the first photoelectric conversion cell and the second photoelectric conversion cell, by joining the first joining layer and the second joining layer.

15. The photovoltaic cell manufacturing method according to claim 8, wherein at least a part of the first buffer layer has a lattice constant that is higher than the lattice constant of the first silicon substrate and lower than the lattice constant of the first photoelectric conversion cell.

16. A photovoltaic cell manufacturing method comprising:
  depositing a first buffer layer for performing lattice relaxation on a first silicon substrate;
  depositing a first photoelectric conversion cell on the first buffer layer, the first photoelectric conversion cell being formed by a compound semiconductor that includes a pn junction, and the first photoelectric conversion cell having a lattice constant that is higher than that of silicon;
  depositing a second buffer layer for performing lattice relaxation on a second silicon substrate;
  depositing a second photoelectric conversion cell on the second buffer layer, the second photoelectric conversion cell being formed by a compound semiconductor that includes a pn junction, and the second photoelectric conversion cell having a lattice constant that is higher than that of silicon and that is different from that of the first photoelectric conversion cell;
  forming a first layered body including the first silicon substrate, the first buffer layer, the first photoelectric conversion cell, the second photoelectric conversion cell, the second buffer layer, and the second silicon substrate, by bonding the first photoelectric conversion cell and the second photoelectric conversion cell;
  removing the second silicon substrate and the second buffer layer, included in the second layered body, from the second photoelectric conversion cell;
  connecting a support substrate to the second photoelectric conversion cell that is included in another layered body formed by the removing of the second silicon substrate and the second buffer layer from the first layered body; and
  removing the first silicon substrate and the first buffer layer from said another layered body to which the support substrate is connected.

17. The photovoltaic cell manufacturing method according to claim 16, wherein the support substrate is a film made of plastic.

18. The photovoltaic cell manufacturing method according to claim 16, further comprising:
- depositing a first joining layer on the first photoelectric conversion cell after forming the first photoelectric conversion cell; and
- depositing a second joining layer on the second photoelectric conversion cell,
- wherein the forming of the first layered body includes joining the first photoelectric conversion cell and the second photoelectric conversion cell, by joining the first joining layer and the second joining layer.

* * * * *